US012812921B2

(12) United States Patent
Honda et al.

(10) Patent No.: US 12,812,921 B2
(45) Date of Patent: Nov. 24, 2026

(54) SEMICONDUCTOR DEVICE AND METHOD FOR MANUFACTURING SEMICONDUCTOR DEVICE

(71) Applicant: SHINDENGEN ELECTRIC MANUFACTURING CO., LTD., Tokyo (JP)

(72) Inventors: Masaaki Honda, Saitama (JP); Mizue Kitada, Saitama (JP); Rikaho Maruyama, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 309 days.

(21) Appl. No.: 18/834,227

(22) PCT Filed: Jan. 26, 2023

(86) PCT No.: PCT/JP2023/002436
§ 371 (c)(1),
(2) Date: Jul. 30, 2024

(87) PCT Pub. No.: WO2023/149336
PCT Pub. Date: Aug. 10, 2023

(65) Prior Publication Data

US 2025/0176229 A1 May 29, 2025

(30) Foreign Application Priority Data

Feb. 7, 2022 (JP) ................................ 2022-016937

(51) Int. Cl.
*H10D 62/10* (2025.01)
*H10D 30/01* (2025.01)
(Continued)

(52) U.S. Cl.
CPC ....... *H10D 62/102* (2025.01); *H10D 30/0295* (2025.01); *H10D 30/0297* (2025.01);
(Continued)

(58) Field of Classification Search
None
See application file for complete search history.

(56) References Cited

U.S. PATENT DOCUMENTS 9,530,882 B1 * 12/2016 Hsieh ................ H10D 30/0297
2013/0256786 A1 * 10/2013 Hsieh ................ H10D 30/0293
438/270
(Continued)

FOREIGN PATENT DOCUMENTS

JP 2002-528916 A 9/2002
JP 2004-342863 A 12/2004
(Continued)

OTHER PUBLICATIONS

International Search Report in PCT/JP2023/002436, mailed Apr. 25, 2023, 6pp.

*Primary Examiner* — Alexander G Ghyka
(74) *Attorney, Agent, or Firm* — HAUPTMAN HAM, LLP

(57) ABSTRACT

A semiconductor device includes a semiconductor base body, a plurality of trenches, a gate insulation film, a gate electrode, an interlayer insulation film, and a surface electrode. The semiconductor base body has a protruding region of a second conductive type that is formed so as to protrude from a bottom portion of a second-conductive-type semiconductor region and is spaced apart from a trench, a peak position of dopant concentration of the protruding region is deeper than a bottom portion of the second-conductive-type semiconductor region, a total amount of dopants in a depth-direction cross section of the protruding region is equal to or
(Continued)

smaller than a total amount of dopants in a depth-direction cross section of the second-conductive-type region.

11 Claims, 12 Drawing Sheets

(51) Int. Cl.

| | |
|---|---|
| ***H10D 30/66*** | (2025.01) |
| ***H10D 62/13*** | (2025.01) |
| ***H10D 62/60*** | (2025.01) |
| ***H10D 64/23*** | (2025.01) |

(52) U.S. Cl.
CPC ......... *H10D 30/668* (2025.01); *H10D 62/117* (2025.01); *H10D 62/127* (2025.01); *H10D 62/154* (2025.01); *H10D 62/155* (2025.01); *H10D 62/60* (2025.01); *H10D 64/2527* (2025.01)

(56) References Cited

U.S. PATENT DOCUMENTS

| | | | | |
|---|---|---|---|---|
| 2015/0076592 | A1* | 3/2015 | Asahara | H10D 30/0297 257/330 |
| 2016/0020288 | A1 | 1/2016 | Deng et al. | |
| 2016/0351702 | A1* | 12/2016 | Numabe | H10D 30/668 |
| 2017/0317207 | A1* | 11/2017 | Hsieh | H10D 30/0297 |
| 2018/0019331 | A1* | 1/2018 | Sumitomo | H10D 12/421 |
| 2018/0233554 | A1 | 8/2018 | Mitsuzuka et al. | |
| 2019/0229013 | A1 | 7/2019 | Huesken et al. | |
| 2020/0303507 | A1 | 9/2020 | Yilmaz | |
| 2021/0167173 | A1* | 6/2021 | Fujimoto | H10D 12/031 |
| 2024/0347585 | A1* | 10/2024 | Zeng | H10D 30/0291 |

FOREIGN PATENT DOCUMENTS

| | | | |
|---|---|---|---|
| JP | 2012-248760 | A | 12/2012 |
| JP | 2019-096855 | A | 6/2019 |
| WO | 0025365 | A2 | 5/2000 |

* cited by examiner

FIG.4A
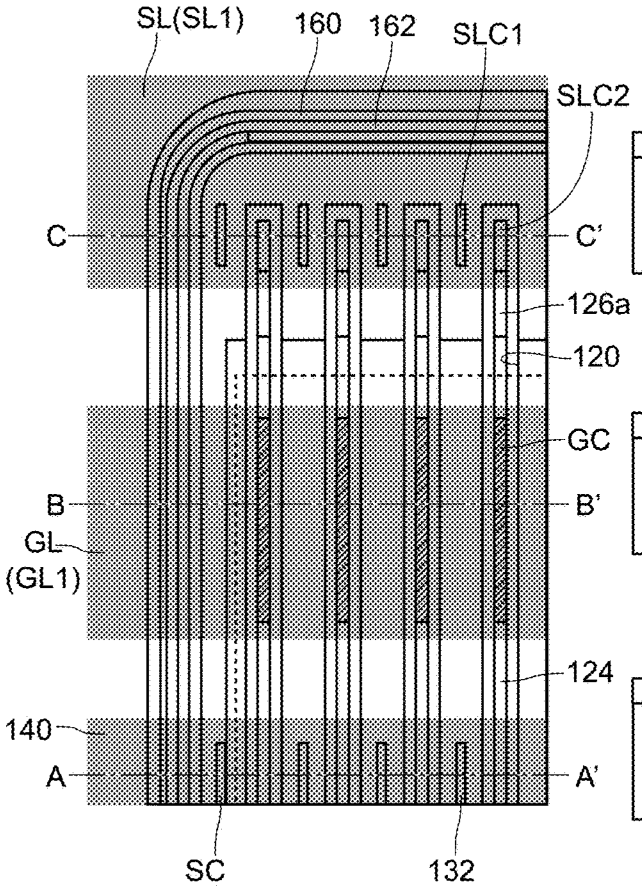
FIG.4B
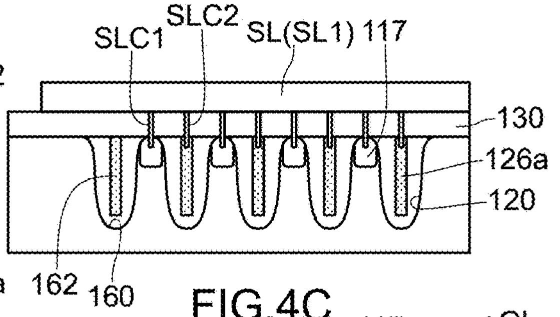
FIG.4C
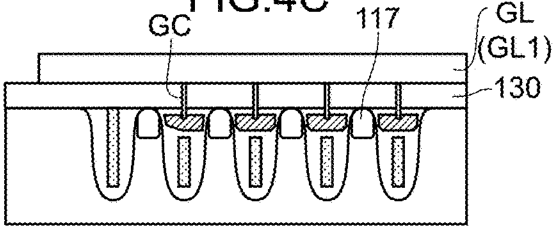
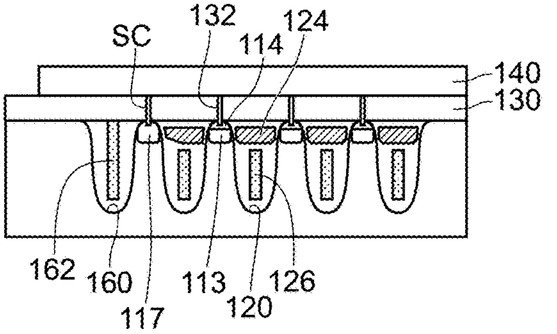
FIG.4D

FIG.9A
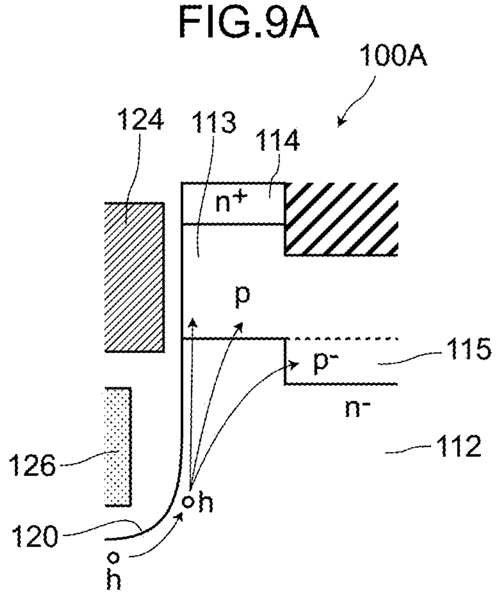
FIG.9B
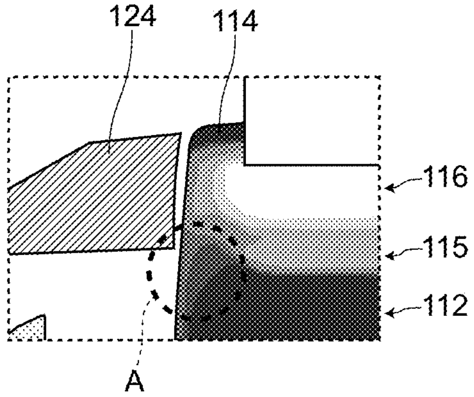
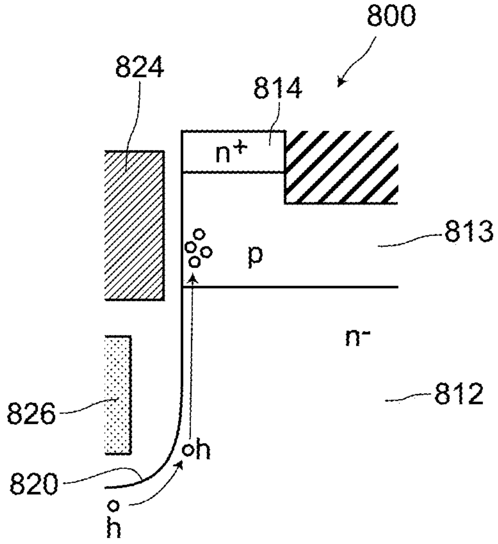
FIG.9C
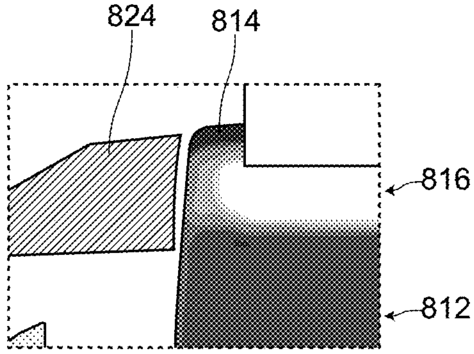
FIG.9D

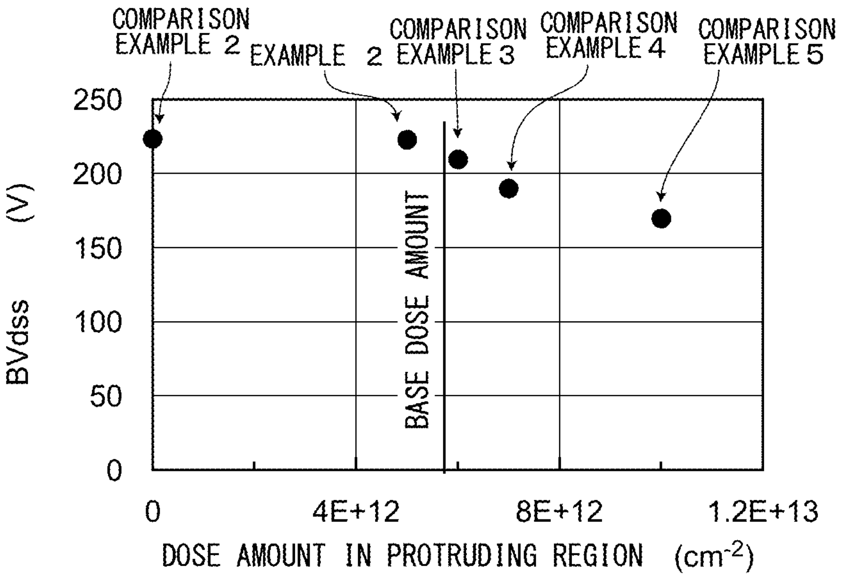
FIG.10
FIG.11
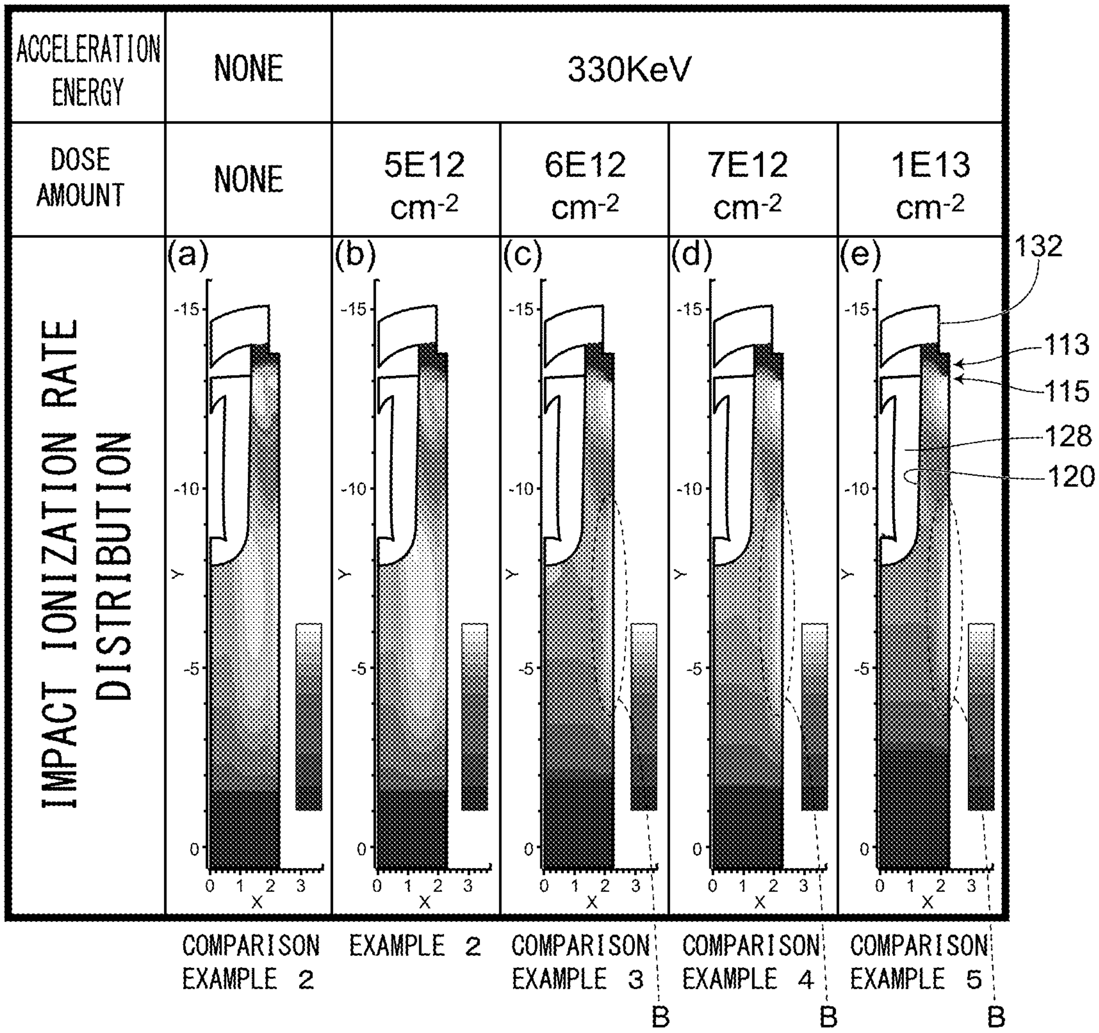

SEMICONDUCTOR DEVICE AND METHOD FOR MANUFACTURING SEMICONDUCTOR DEVICE

RELATED APPLICATIONS

The present application is a National Phase of International Application NO. PCT/JP2023/002436 filed Jan. 26, 2023, which claims priority to Japanese Application NO. 2022-016937, filed Feb. 7, 2022.

TECHNICAL FIELD

The present invention relates to a semiconductor device and a method for manufacturing a semiconductor device.

BACKGROUND ART

Conventionally, there has been known a trench-gate-type semiconductor device (see, for example, Patent literature 1).

FIG. 14 is a cross-sectional view illustrating a conventional semiconductor device 900. As illustrated in FIG. 14, the conventional semiconductor device 900 includes: a semiconductor base body 910 having an $n^+$-type low resistance semiconductor layer 911, an n-type drift layer 912, a p-type base region 913 formed on a surface of the drift layer 912, and an n-type ($n^+$-type) source region 914 formed on a surface of the base region 913; a trench 920 formed on a surface of the semiconductor base body 910, having a lowermost bottom portion thereof disposed adjacently to the drift layer 912 and side walls thereof disposed adjacently to the drift layer 912, the base region 913 and a source region 914; gate insulation films 922 formed on side walls of the trench 920; a gate electrode 924 formed in the trench 920 by way of the gate insulation films 922; and a surface electrode 940 connected to the source region 914. The conventional semiconductor device 900 is a semiconductor device having a shield gate structure where the semiconductor device 900 further includes, in the trench 920, a shield electrode 926 that is formed at a position spaced apart from the gate electrode 924 and an inner peripheral surface of the trench 920, and insulation regions 928 that are formed between the gate electrode 924 and the shield electrode 926 and between the shield electrode 926 and an inner peripheral surface of the trench 920.

The conventional semiconductor device 900 is a so-called trench-gate-type semiconductor device that includes the trench 920 and the gate electrode 924 formed in the trench 920 by way of the gate insulation film 922. Accordingly, a channel can be formed in a depth direction of the semiconductor base body 910 and hence, a chip size can be made small compared to a planar-gate-type semiconductor device. Further, in the planar-gate-type semiconductor device, to prevent a J-FET effect that a depletion layer extends from a neighboring channel region and narrows a path of a current, it is necessary to ensure a distance between channels to some extent. On the other hand, in the trench-gate-type semiconductor device, there is no such restriction and hence, a chip size can be made small also from this point of view.

CITATION LIST

Patent Literature

PTL 1: Japanese translation of PCT International Application Publication No. JP 2002-528916

SUMMARY OF INVENTION

Technical Problem

In general, in a semiconductor device, there has been a request of reducing an ON resistance by increasing dopant concentration of a drift layer. However, when dopant concentration in the drift layer 912 is increased in the conventional semiconductor device 900, the depletion of the drift layer 912 becomes difficult. Accordingly, to enable the depletion of the drift layer 912, it is necessary to increase a drain voltage. In this case, a gate-drain quantity of charge Qgd is increased thus giving rise to a drawback that a switching loss and a gate drive loss are increased.

Further, when an avalanche breakdown occurs, due to a low potential on an interface between the insulation region 928 (oxide film) and the semiconductor base body 910, holes formed in the vicinity of a bottom portion of the trench 920 are liable to flow into the base region 913 along an edge of the trench 920 (see FIG. 9C and FIG. 9D). Accordingly, a large amount of holes flow into an area of the base region 913 that is in contact with the trench 920. As a result, a potential of the base region 913 is locally increased thus giving rise to a drawback that a parasitic bipolar operation may occur.

The above-mentioned drawback is not a drawback that may occur only in a semiconductor device having a shied-gate-structure, and is a drawback that may occur also in a trench-gate-type semiconductor device in general.

The present invention has been made to overcome such drawbacks, and it is an object of the present invention to provide a semiconductor device where, even in a case that dopant concentration in a first-conductive-type semiconductor layer is increased, a switching loss and a gate drive loss are small, and a parasitic bipolar operation minimally occurs, and a method for manufacturing such a semiconductor device.

Solution to Problem

A semiconductor device according to the present invention includes: a semiconductor base body including a first-conductive-type semiconductor layer, a second-conductive-type semiconductor region formed on a surface of the first-conductive-type semiconductor layer, and a first-conductive-type semiconductor region formed on a surface of the second-conductive-type semiconductor region; a plurality of trenches formed on a surface of the semiconductor base body, wherein, in each of the plurality of trenches, a lowermost bottom portion is brought into contact with the first-conductive-type semiconductor layer, and a side wall is brought into contact with the first-conductive-type semiconductor layer, the second-conductive-type semiconductor region and first-conductive-type the semiconductor region; a gate insulation film formed on the side wall of each of the plurality of trenches; a gate electrode formed in each of the plurality of trenches by way of the gate insulation film; an interlayer insulation film formed above the gate electrode and the semiconductor base body: and a surface electrode formed on the interlayer insulation film, the surface electrode being connected to the second-conductive-type semiconductor region and the first-conductive-type semiconductor region, wherein the semiconductor base body includes, in a region sandwiched by the trenches disposed adjacently to each other, a second-conductive-type protruding region that is formed so as to protrude first-conductive-type semiconductor layer from a bottom portion of the second-conductive-type semiconductor region, and is spaced apart from the trench, a depth position of a deepest portion of the protruding region is shallower than a depth position of a deepest portion of the trench, a peak position of dopant concentration in the protruding region is deeper than a bottom portion of the second-conductive-type semiconductor region, and a total amount of dopants in a depth-direction cross section of the protruding region is equal to or smaller than a total amount of dopants in a depth-direction cross section of the second-conductive-type semiconductor region.

In the present specification, "total amount of dopants in a depth-direction cross section" means a value obtained by integrating dopant concentration for every unit depth in the depth direction (see FIG. 2B).

A method for manufacturing a semiconductor device according to the present invention includes: a semiconductor base body preparation step of preparing a semiconductor base body that includes a first-conductive-type semiconductor layer; a second-conductive-type semiconductor region of a second conductive type formed on a surface of the first conductive-type semiconductor layer; and a first-conductive-type semiconductor region formed on a surface of the second-conductive-type semiconductor region; a trench forming step of forming a plurality of trenches on one surface of the semiconductor base body, wherein, in each of the plurality of trenches, a lowermost bottom portion is brought into contact with the first-conductive-type semiconductor layer, and a side wall is brought into contact with the first-conductive-type semiconductor layer, the second-conductive-type semiconductor region and the first-conductive-type semiconductor region; a gate insulation film forming step of forming a gate insulation film formed on a region of the side wall of each of the plurality of trenches, the region of the side wall being in contact with at least the second-conductive-type semiconductor region; a gate electrode forming step of forming a gate electrode in each of the plurality of trenches by way of the gate insulation film; an interlayer insulation film forming step of forming an interlayer insulation film above the gate electrode and a surface of the semiconductor base body: a contact trench forming step of forming a contact trench in the interlayer insulation film, the contact trench having a depth that allows the contact trench to reach at least the second-conductive-type semiconductor region of the semiconductor base body; a second-conductive-type dopant doping step of doping second-conductive-type dopants toward a bottom portion of the contact trench such that a peak position of dopant concentration becomes deeper than a bottom portion of the second-conductive-type semiconductor region: and a protruding region forming step of forming a second-conductive-type protruding region in a region sandwiched between the trenches disposed adjacently to each other by diffusing the second-conductive-type dopants, the second-conductive-type protruding region being spaced apart from the trenches, the second-conductive-type protruding region being formed so as to protrude toward the first-conductive-type semiconductor layer from a bottom portion of the second-conductive-type semiconductor region, a depth position of a deepest portion of the second-conductive-type protruding region being shallower than a depth position of deepest portions of the trenches, a total amount of dopants in a depth direction cross section of the protruding region being equal to or smaller than a total amount of dopants in a depth direction cross section of the second-conductive-type semiconductor region.

Advantageous Effect of the Invention

According to the semiconductor device and the method for manufacturing a semiconductor device of the present invention, the semiconductor base body includes the protruding region of the second conductive type that is formed so as to protrude toward the first conductive type semiconductor layer from the bottom portion of the second-conductive-type semiconductor region in the region sandwiched by the trenches disposed adjacently to each other, and is spaced apart from the trenches. Accordingly, not only a depletion layer expands in a vertical direction from a pn junction between the second-conductive-type semiconductor region and the first-conductive-type semiconductor region but also the depletion layer expands also in the lateral direction from a pn junction on the side surface of the protruding region. Accordingly, even in a case where the first-conductive-type semiconductor layer between the trench and the protruding region is liable to be easily depleted so that dopant concentration in the first-conductive-type semiconductor layer is increased, it is possible to deplete the first-conductive-type semiconductor layer without increasing a drain voltage more than necessary. As a result, it is sufficient to set a gate-drain quantity of charge Qgd to a small value and hence, a switching loss and a gate drive loss can be reduced.

Furthermore, the gate-drain quantity Qgd of charge can be set to a small value and hence, in turning on or off the gate, a time necessary for charging or discharging a gate-drain capacitance Cgd can be shortened whereby a switching speed is increased.

Further, by adopting such a structure, the gate-drain capacitance Cgd is reduced and hence, Cgd/(Cgs+Cgd) is reduced. As a result, it is also possible to acquire an advantageous effect that a false firing of a gate referred to as self-turn-on or shoot through can be suppressed.

Further, according to the semiconductor device and the method for manufacturing a semiconductor device according to the present invention, the above-mentioned configuration is adopted and hence, when an avalanche breakdown occurs, holes generated in the vicinity of the bottom portion of the trench flow into not only a region disposed adjacently to the trench in the second-conductive-type semiconductor region but also the protruding region (see FIG. 9A and FIG. 9B). Accordingly, a path for holes that flow into the second-conductive-type semiconductor region is widened and hence, it is possible to prevent the occurrence of a phenomenon that a potential of the second-conductive-type semiconductor region is locally increased. As a result, it is possible to prevent the occurrence of a parasitic bipolar operation.

In a case where a total amount of dopants in a depth-direction cross section of the protruding region is set larger than a total amount of dopants in a depth-direction cross section of the second-conductive-type semiconductor region, when an avalanche breakdown occurs, an impact ionization is liable to occur in the vicinity of an intermediate position between the trenches disposed adjacently to each other so that an electric field is concentrated to the intermediate position between the trenches disposed adjacently to each other and a breakdown strength is lowered (see FIG. 11(*c*) to FIG. 11(*e*)). On the other hand, according to the semiconductor device and the method for manufacturing a semiconductor device according to the present invention, a total amount of dopants in the depth-direction cross section of the protruding region is set equal or smaller than a total amount of dopants in the depth-direction cross section of the second-conductive-type semiconductor region. As a result, when an avalanche breakdown occurs, an impact ionization is liable to occur around the trench and hence, regions where avalanche breakdown occurs are dispersed (see FIG. 11(*b*)). Accordingly, it is possible to prevent the occurrence of the phenomenon that an electric field concentrates on the region in the vicinity of the intermediate position between the trenches disposed adjacently to each other and hence, lowering of a breakdown strength can be prevented.

Further, in a case where the depth position of the deepest portion of the protruding region is deeper than the depth position of the deepest portion of the trench, when the transistor is in a gate-on state, a current path that is formed when a current is made to flow between a source and a drain is closed so that an ON resistance is increased. On the other hand, according to the semiconductor device and the method for manufacturing a semiconductor device according to the present invention, the depth position of the deepest portion of the protruding region is shallower than the depth position of the deepest portion of the trench and hence, even when a current is made to flow between the source and the drain, the current path is minimally closed whereby the ON resistance is minimally lowered.

BRIEF DESCRIPTION OF DRAWINGS

FIG. 1A indicates a plan view of the semiconductor device 100, and FIG. 1B indicates a cross-sectional view taken along a line A-A in FIG. 1A.

FIG. 2A indicates a cross-sectional view of the semiconductor 100, and FIG. 2B indicates a graph of dopant concentration with respect to a depth between a broken line A-A' and a broken line B-B' in FIG. 2A.

FIG. 4A to FIG. 4D are enlarged views of a main part of a peripheral portion of the semiconductor device 100 according to the embodiment 1. FIG. 4(*a*) is an enlarged plan view of the main part of the peripheral portion of the semiconductor device 100, FIG. 4B is a cross-sectional view taken along a line A-A' in FIG. 4A, FIG. 4C is a cross-sectional view taken along a line B-B' in FIG. 4A, and FIG. 4D is a cross-sectional view taken along a line C-C' in FIG. 4A.

FIG. 5A to FIG. 5D are respective step views.

FIG. 6A to FIG. 6D are respective step views.

FIG. 7A to FIG. 7D are respective step views.

FIG. 8A to FIG. 8D are respective step views.

FIG. 9A to FIG. 9D are views for describing an advantageous effect of the semiconductor device 100 according to the embodiment 1. FIG. 9A is a schematic view illustrating movement of holes when an avalanche breakdown of the semiconductor device according to an embodiment 1, FIG. 9B illustrates hole current density distribution when the avalanche breakdown occurs in the semiconductor device according to the embodiment 1, FIG. 9C is a schematic view illustrating the movement of holes when an avalanche breakdown occurs in a semiconductor device according to a comparison example 1, and FIG. 9D illustrates a hole current density distribution when the avalanche breakdown occurs in the semiconductor device according to the comparison example 1.

FIG. 10 is a graph illustrating a dose amount and a breakdown strength in a protruding region in an embodiment 2 and comparison examples 2 to 5.

FIG. 11 is a graph illustrating impact ionization distribution in the embodiment 2 and the comparison examples 2 to 5. FIG. 11(*a*) illustrates the impact ionization rate distribution of the comparison example 2, FIG. 11(*b*) illustrates the impact ionization rate distribution in the embodiment 2, and FIG. 11(*c*) to FIG. 11(*e*) illustrate the impact ionization rate distributions in the comparison examples 3 to 5.

DESCRIPTION OF EMBODIMENTS

Hereinafter, a semiconductor device and a method for manufacturing the semiconductor device according to the present invention are described based on embodiments illustrated in drawings. The embodiments described hereinafter are not intended to limit the invention according to claims. Further, it is not always the case that all of various components described in the embodiment and all combinations of these components are indispensable as means for overcoming the present invention.

Embodiment 1

1. Configuration of Semiconductor Device 100 According to Embodiment 1

Figure 1A:
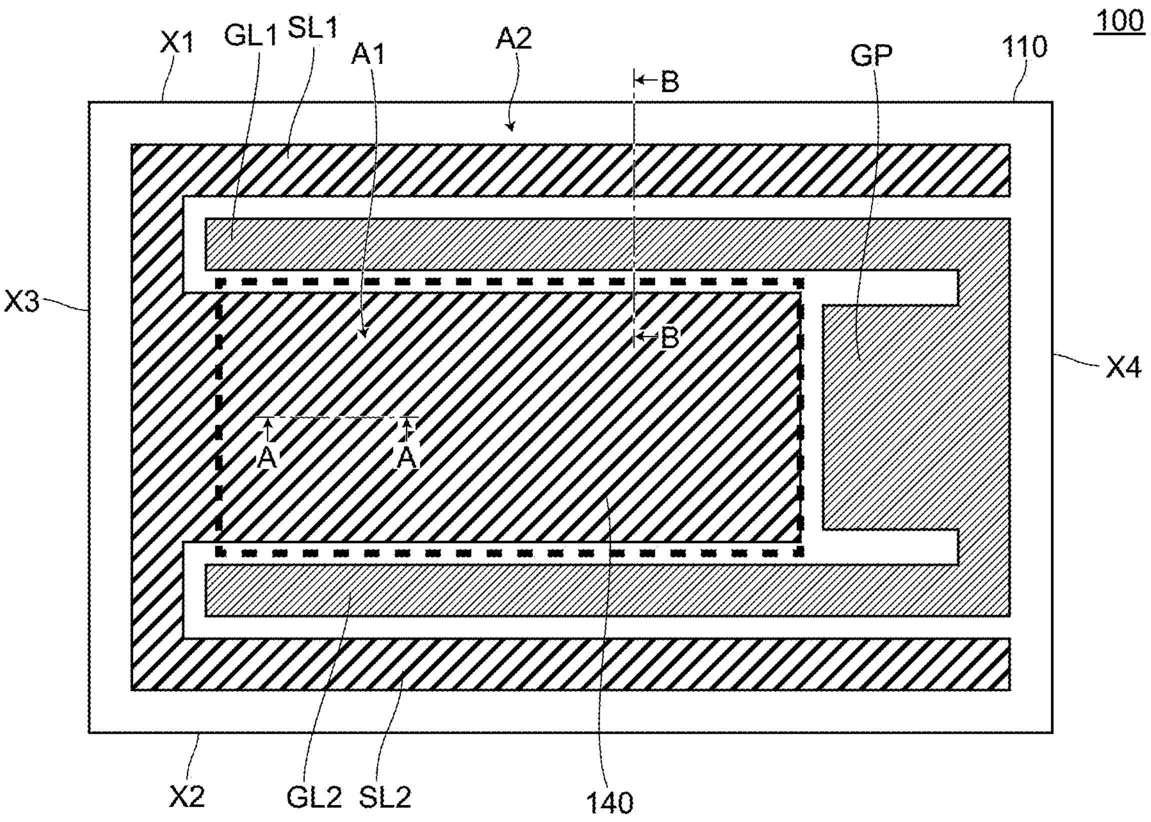
FIG. 1A and FIG. 1B are views illustrating a semiconductor device 100 according to an embodiment 1.
Figure 1B:
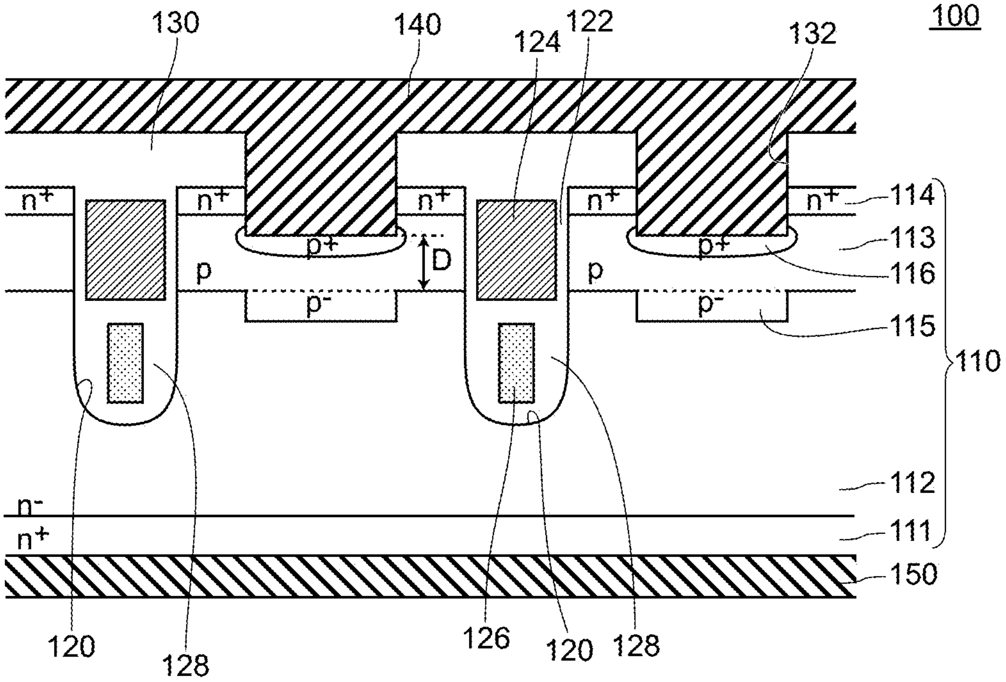

FIG. 1A and FIG. 1B are views illustrating a semiconductor device 100 according to an embodiment 1. The semiconductor device 100 according to the embodiment 1 has, as illustrated in FIG. 1A, an approximately rectangular shape as viewed in a plan view that is formed of two long sides X1, X2 and two short sides X3, X4. In semiconductor device 100 according to the embodiment 1, on a surface of the semiconductor base body 110, a source electrode 140, source lines SL1, SL2, a gate pad GP and gate lines GL1, GL2 are disposed. In the semiconductor base body 110, a cell region A1 that is formed in a center region where the source electrode 140 is disposed, and a peripheral region A2 that is formed so as to surround a periphery of the cell region A1 are defined.

The source electrode (surface electrode) 140 has a rectangular shape that is disposed on a center portion of the semiconductor base body 110 and extends toward the short side X3 side from the center portion as viewed in a plan view. The source line SL1 extends from an end portion of the source electrode 140 on a short side X3 side to a long side X1 side along the short side X3, and is bent toward a short side X4 side at a corner portion of the semiconductor base body 110 and extends along the long side X1. The source line SL2 extends from an end portion of the source electrode 140 on a short side X3 side to a long side X2 side along the short side X3, and is bent toward a short side X4 side at a corner portion of the semiconductor base body 110 and extends along the long side X2. Both the source lines SL1 and SL2 are connected to the source electrode 140.

The gate pad GP has a rectangular shape and is formed such that the gate pad GP protrudes toward the center from a short side X4 side in the vicinity of the center of the semiconductor base body 110 on a short side X4 side as viewed in a plan view. The gate line GL1 extends from an end portion of the gate pad GP on a short side X4 side to a long side X1 side along the short side X4, is bent toward a short side X3 side at an intermediate portion thereof, and extends between the source electrode 140 and the source line SL1 along the long side X1. The gate line GL2 extends from an end portion of the gate pad GP on a short side X4 side to a long side X2 side along the short side X4, is bent toward a short side X3 side at an intermediate portion thereof, and extends between the source electrode 140 and the source line SL2 along the long side X2. Both the gate lines GL1, GL2 are connected to the gate pad GP. Further, the source electrode 140 and the source lines SL1, SL2 are spaced apart from the gate pad GP and the gate lines GL1, GL2.

The source electrode 140, the source lines SL1, SL2, the gate pad GP and the gate lines GL1, GL2 are formed of an Al film or an Al alloy film (for example, an AlSi film) having a thickness of 1 μm to 10 μm (for example, 3 μm), and are collectively formed.

Next, the configuration of the cell region A1 is described. The semiconductor device 100 according to the embodiment 1 includes, in the cell region A1, as illustrated in FIG. 1B, the semiconductor base body 110, a plurality of trenches 120, a gate insulation film 122, a gate electrode 124, a shield electrode 126, an insulation region 128, an interlayer insulation film 130, a contact trench 132, the source electrode 140, and a drain electrode 150 thus forming a MOS (a metal-oxide-semiconductor) structure.

The semiconductor base body 110 includes: an n type ($n^+$-type) low resistance semiconductor layer 111; an n-type drift layer (a first-conductive type semiconductor layer) 112 having lower dopant concentration than the low resistance semiconductor layer 111; a p-type base region (a second-conductive-type semiconductor region) 113 formed on a surface of the drift layer 112; an n-type ($n^+$-type) source region 114 formed on a surface of the base region 113; a p-type ($p^-$-type) protruding region 115 formed in a region between the trenches 120 disposed adjacently to each other in a state where the protruding region 115 is formed so as to protrude toward the drift layer 112 from a bottom portion of the base region 113, and is spaced apart from the trench 120; and p-type ($p^+$-type) contact region 116 formed in a region where the contact region 116 is brought into contact with a bottom portion of the contact trench 132 and having higher dopant concentration than the base region 113.

Figure 2A:
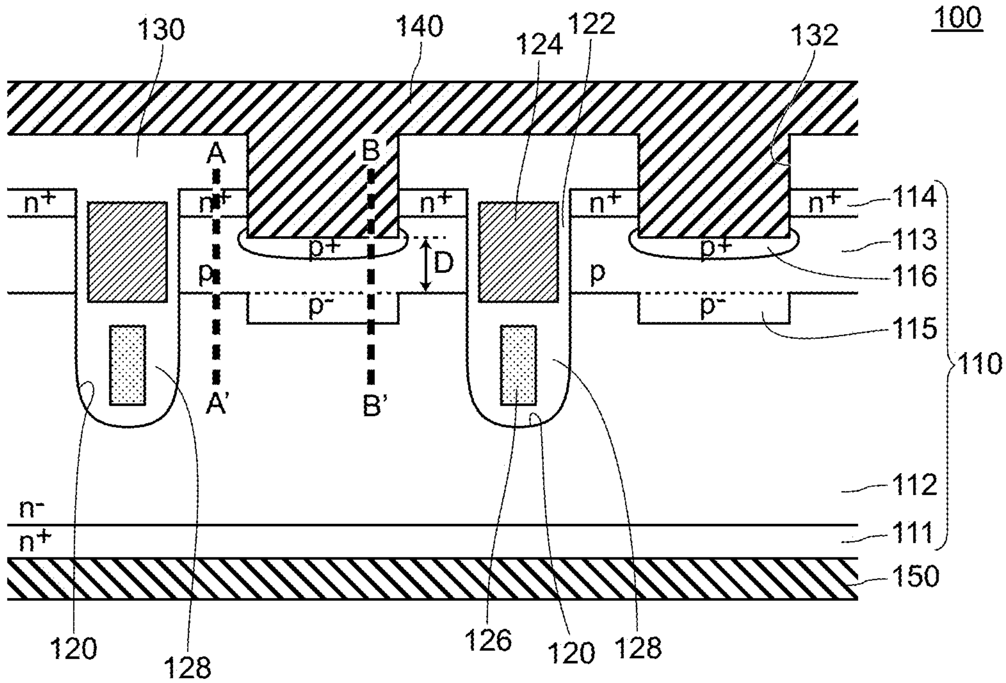
FIG. 2A and FIG. 2B are views illustrating a total amount of dopants in a cross section in a depth direction of a base region 113 and a protruding region 115 in the semiconductor device 100 according to an embodiment 1.
Figure 2B:
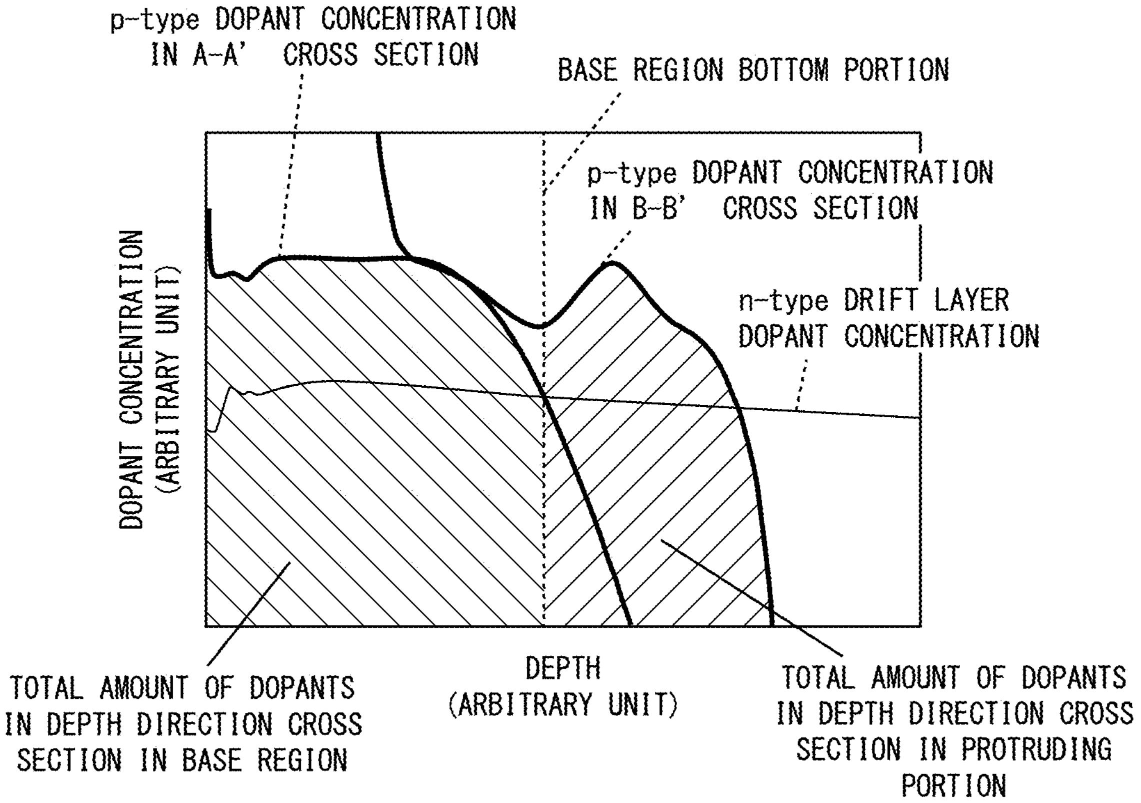

FIG. 2A and FIG. 2B are views for describing a total amount of dopants in a depth direction cross section of the base region and protruding region of the semiconductor device 100 according to the embodiment 1.

The protruding region 115 is formed at the center of a region sandwiched by trenches 120 disposed adjacently to each other, and is formed below the contact trench 132. A depth position of the deepest portion of the protruding region 115 is shallower than a depth position of a deepest portion of the trench 120. A peak position of dopant concentration of the protruding region 115 is deeper than a bottom portion of the base region 113. Further, a total amount of dopants in a depth direction cross section of the protruding region 115 is smaller than a total amount of dopants in a depth direction cross section of the base region 113. More specifically, in a case where a depth direction is indicated by y, "y=0" indicates a depth position of a surface of the semiconductor base body 110 indicated by a broken line A-A' in FIG. 2A, dopant concentration for every unit volume at the broken line A-A' in FIG. 2A is indicated by $N_A$ (A-A'), and dopant concentration for every unit volume at the broken line B-B' in FIG. 2A is indicated by $N_A$ (B-B'), the following formula is established. In the formula, "the base joining depth" means a depth of a region where a bottom portion of the base region 113 and the drift layer 112 are joined to each other by pn junction, and "protruding region depth" means a depth of a lowermost portion of the protruding region 115.

$$\int_{0}^{\text{base joining depth}} N_A(A-A')dy > \int_{\text{base joining depth}}^{\text{protruding region depth}} N_A(B-B')dy$$

A point that the total amount of dopants in the depth direction cross section of the protruding region 115 is smaller than the total amount of dopants in the depth direction cross section of the base region 113 is described in detail.

The total amount of dopants in the depth direction cross section of the protruding region 115 (a hatched region on a right side in FIG. 2B) becomes an area of the region surrounded by a straight line indicating "base region bottom portion", a curve of "p-type dopant concentration in a B-B' cross section", and an axis of abscissas in FIG. 2B.

On the other hand, the total amount of dopants in the depth direction cross section of the base region (a hatched region on a left side in FIG. 2B) becomes an area of the region surrounded by a straight line indicating "base region bottom portion", a curve of "p-type dopant concentration in an A-A' cross section", an axis or ordinates, and an axis of abscissas in FIG. 2B. The total amount of dopants in the depth direction cross section of the base region is equal to a total amount of dopants of the depth direction cross section of the base region in a case where neither the contact trench 132 nor the contact region 116 is formed.

Accordingly, as can be understood from FIG. 2B, the total amount of dopants in the depth direction cross section of the protruding region 115 is smaller than the total amount of dopants in the depth direction cross section of the base region 113. It is sufficient that the total amount of dopants in the protruding region 115 is equal to or smaller than the total amount of dopants in the depth direction cross section in the base region 113. For example, the dopant concentration in the protruding region 115 may be set high and a depth of the protruding region 115 may be set shallow. Alternatively, the dopant concentration in the protruding region 115 may be set low and the depth of the protruding region 115 may be increased.

Further, in the B-B' cross section, a total amount of dopants in a depth direction cross section of the semiconductor base body 110 from a contact position between the source electrode 140 and the semiconductor base body 110 to a bottom portion of the base region (a sum of the total dopant concentration in the contact region 116 and the total amount of dopants in the depth direction cross section of the base region 113) becomes, in FIG. 2B, an area of a region surrounded by a straight line indicating "the bottom portion of the base region", a curve indicating "P-type dopant concentration in the B-B' cross section" and an axis of abscissas. The total amount of dopants in the depth direction cross section of the protruding region 115 is smaller than a total amount of dopants in the depth direction cross section of this region.

In the embodiment 1, as viewed in a plan view, a plurality of trenches 120 extend in parallel to each other at a predetermined interval from a region that overlaps with the source line SL1 on a long side X1 side to a region that overlaps with the source line SL2 on a long side X2 side traversing a region that overlaps with the source electrode 140 (the configuration not illustrated in the drawing). As illustrated in FIG. 1B, the trenches 120 are formed on a surface of the semiconductor base body 110. In each trench 120, a lowermost bottom portion is brought into contact with the drift layer 112, and side walls are brought into contact with the drift layer 112, the base region 113 and the source region 114. Although a bottom surface of the trench 120 is rounded, the bottom surface may be formed in a flat shape or may be formed in other suitable shapes.

The gate insulation film 122 is formed on upper portions of side walls of each of the plurality of trenches 120. More specifically, the gate insulation film 122 is formed at a position where the gate insulation film 122 is brought into contact with a portion of the drift layer 112, the base region 113 and a portion of the source region 114. The gate insulation film 122 is formed of a thermal oxide film. The gate electrode 124 is formed in the inside each of the plurality of trenches 120 by way of the gate insulation film 122 at a position where the gate electrode 124 faces the base region 113. The gate electrode 124 is made of polysilicon.

The shield electrode 126 is formed at a position spaced apart from the gate electrode 124 and an inner peripheral surface of the trench 120. The shield electrode 126 is made of polysilicon. The insulation region 128 is formed between the gate electrode 124 and the shield electrode 126, and between the shield electrode 126 and the inner peripheral surface of the trench 120 so as to provide insulation between the gate electrode 124 and the shield electrode 126 and between the shield electrode 126 and the semiconductor base body 110. The insulation region 128 is formed of, for example, an oxide film formed by a CVD method.

The gate insulation film 122, the gate electrode 124, the shield electrode 126 and the insulation region 128 are disposed in the trench 120, and extend in the trench 120 from the long side X1 side to the long side X2 side in a stripe shape.

The gate electrode 124 and the gate insulation film 122 extend from a region that overlaps with the gate line GL1 in the peripheral region A2 to the region that overlaps with the gate line GL2 while passing a region that overlaps with the source electrode 140. The gate electrode 124 is connected to the gate line GL via a contact plug GLC in a region that overlaps with the gate lines GL1, GL2 (see FIG. 4C).

Further, as viewed in a plan view, at an end portion on a long side X1 side than the gate line GL1 and at an end portion on a long side X2 side than the gate line GL2, neither the gate electrode 124 nor the gate insulation film 122 is formed. In the trench, the shield electrode 126 and the insulation region 128 are formed to an upper side in the trench 120 (see FIG. 4(*b*)). The shield electrode 126 is electrically connected with the source lines SL1, SL2 on which the gate electrode 124 is formed via the contact plug SLC2 at the end portion on the long side X1 side of the trench 120 and at an end portion on the long side X2 side of the trench 120.

As illustrated in FIG. 1A and FIG. 1B, the interlayer insulation film 130 is formed on surfaces of the gate electrodes 124, surfaces of the gate insulation films 122, and the surface of the semiconductor base body 110. The interlayer insulation film 130 is, for example, an oxide film formed by a CVD method.

The contact trench 132 extends between the trenches 120 disposed adjacently to each other as viewed in a plan view in parallel to the trench 120 from a long side X1 side toward a long side X2 side (not illustrated in the drawings). As illustrated in FIG. 1B, the contact trench 132 is formed such that the contact trench 132 penetrates the interlayer insulation film 130, and has a depth deeper than a depth position of a bottom portion of the source region 114. A bottom portion of the contact trench 132 is brought into contact with the contact region 116, and side walls of the contact trench 132 are brought into contact with the source region 114 and the base region 113.

The source electrode 140 is formed on the interlayer insulation film 130, and is connected with the base region 113, the source region 114 and the contact regions 116 via the contact trenches 132.

The drain electrode 150 is disposed on the entirety of a back surface side (on a surface of the low resistance semiconductor layer 111) of the semiconductor base body 110. The drain electrode 150 is formed of a laminated film formed by laminating a Ti layer, an Ni layer, and Au layer (or an Ag layer) in this order. A thickness of the drain electrode 150 is 0.2 μm to 1.5 μm (for example, 1 μm).

Figure 3:
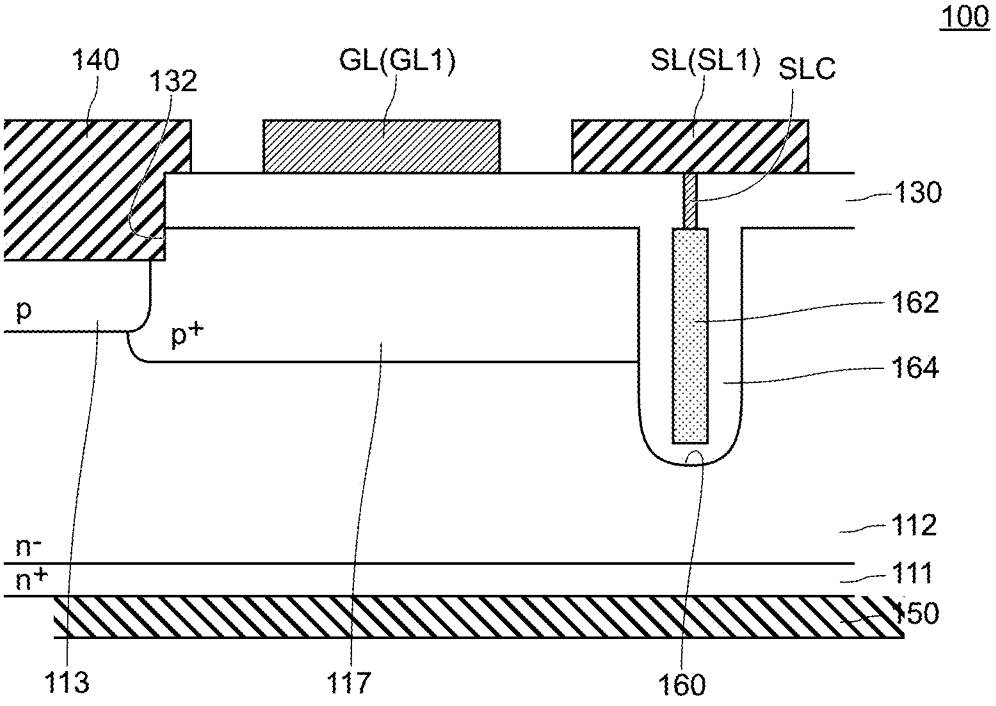
FIG. 3 indicates a cross-sectional view taken along a line B-B in FIG. 1A.

Next, the configuration of the peripheral region A2 is described. FIG. 3 is a cross-sectional view taken along a line B-B in FIG. 1A. FIG. 4A to FIG. 4D are enlarged views of a main part of a peripheral portion of the semiconductor device 100 according to the embodiment 1. According to the semiconductor device 100 of the embodiment 1, in the peripheral region A2, as illustrated in FIG. 1A, FIG. 3 and FIG. 4A to FIG. 4D, the semiconductor base body 110, an outermost peripheral trench 160, an embedded electrode 162, the insulation region 164, an interlayer insulation film 130, the gate pad GP, the gate lines GL1, GL2, and the source lines SL1, SL2 are disposed. As illustrated in FIG. 4C, the trench 120 extends from the cell region A1. The gate electrode 124 in the trench 120 is connected with the gate lines GL1, GL2 via the contact plugs GC. The shield electrode 126 in the trench 120 is connected with the source lines SL1, SL2 via the contact plugs SLC2 (see FIG. 4B).

As illustrated in FIG. 3, the semiconductor base body 110 includes the low resistance semiconductor layer 111, the drift layer 112 and a p-type peripheral region 117 in the peripheral region A2.

In the peripheral region A2, the p-type peripheral region 117 is a semiconductor region of a p-type ($P^+$-type) formed on a surface of the drift layer 112. The p-type peripheral region 117 is connected with a base region 113 at an end portion on a cell region A1 side. Further, the p-type peripheral region 117 is connected with the source electrode 140 via the contact trench 132 on the cell region A1 side, and is connected with the source lines SL1, SL2 via the contact plugs SLC1 in the vicinity of the respective end portions on a long side X1 side and a long side X2 side (see FIG. 4A and FIG. 4B). A depth position of a lowermost bottom portion of the p-type peripheral region 117 is deeper than a depth position of a lowermost bottom portion of the base region 113. Further, a total amount of dopants in a depth-direction cross section in the p-type peripheral region 117 is larger than a total amount of dopants in a depth-direction cross section in the base region 113. Accordingly, in a case where a depth of the p-type peripheral region 117 is set relatively deep, dopant concentration may be set relatively low. Alternatively, in a case where the depth of the p-type peripheral region 117 is relatively shallow, the dopant concentration may be set relatively high. In the peripheral region A2, the protruding regions 115 are not formed. Further, between the outermost peripheral trench 160 and the trench 120, neither the source region 114 nor the base region 113 is formed.

As illustrated in FIG. 3 and FIG. 4A to FIG. 4D, the outermost peripheral trench 160 is formed so as to surround the entire circumference of an outermost periphery of the semiconductor base body 110. The embedded electrode 162 is disposed in the outermost peripheral trench 160 in a spaced-apart manner from the inner peripheral surface of the outermost peripheral trench 160. The embedded electrode 162 is made of polysilicon. The embedded electrode 162 is electrically connected with the source electrode 140 via the contact plug SLC. The insulation region 164 is disposed between the embedded electrode 162 and the inner peripheral surface of the outermost peripheral trench 160 in the outermost peripheral trench 160. The insulation region 164 is, for example, an oxide film formed by a CVD method.

2. Method for Manufacturing Semiconductor Device According to Embodiment 1

Next, a method for manufacturing the semiconductor device according to the embodiment 1 is described. FIG. 5A to FIG. 8D are views illustrating the method for manufacturing the semiconductor device 100 according to the embodiment 1. The method for manufacturing the semiconductor device according to the embodiment 1 includes a semiconductor base body preparation step, a trench forming step, an insulation region forming step, a shield electrode forming step, an insulation region forming step, a gate insulation film forming step, a gate electrode forming step, an interlayer insulation film forming step, a contact trench forming step, a first p-type dopant doping step, a second p-type dopant doping step, a protruding-region and contact-region forming step, and a front-surface-electrode and back-surface-electrode forming step in this order.

(1) Semiconductor Base Body Preparation Step

First, the semiconductor base body 110 that has the low resistance semiconductor layer 111 of an n-type ($n^+$-type), the drift layer 112 of an n-type having lower dopant concentration than the low resistance semiconductor layer 111, the base region 113 of a p-type formed on the surface of the drift layer 112, and the source region 114 of an n-type ($n^+$-type) formed on the entire surface of the base region 113 in the cell region A1 (see FIG. 5A) and has the semiconductor base body 110 including the low resistance semiconductor layer 111, the drift layer 112, and the p-type peripheral region 117 of a p-type ($p^+$-type) formed on the surface of the drift layer 112 in the peripheral region A2 is prepared.

(2) Trench Forming Step

Figure 5A:
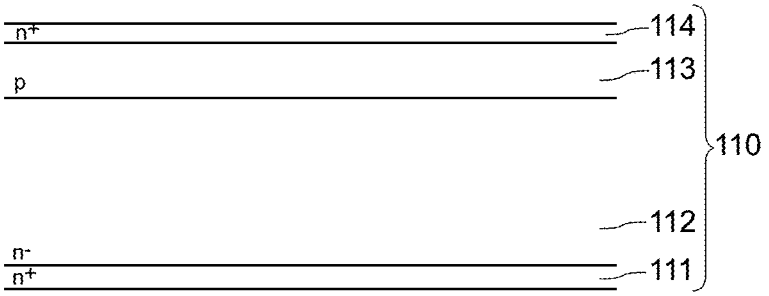
FIG. 5A to FIG. 5D are views illustrating a method for manufacturing the semiconductor device 100 according to the embodiment 1.
Figure 5B:
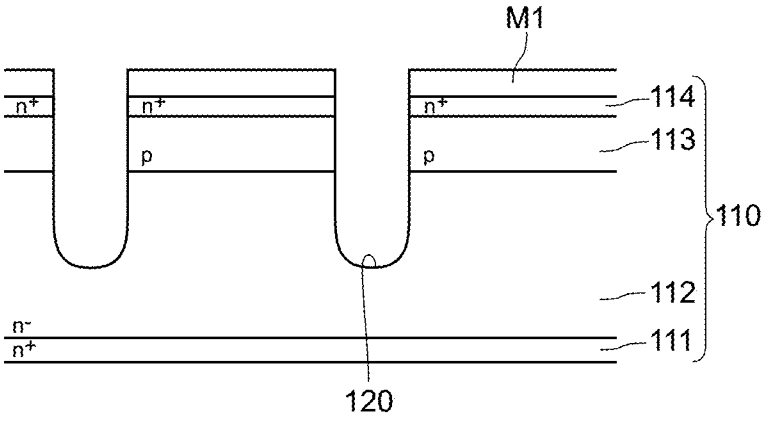

Next, the trenches 120 are formed on the surface (the surface on a source region 114 side) of the semiconductor base body 110 at a predetermined interval in such a manner that the lowermost bottom portion of the trench 120 is brought into contact with the drift layer 112 and the side walls of the trench 120 are brought into contact with the drift layer 112, the base region 113 and the source region 114 (see FIG. 5B). In the trench forming step, a plurality of trenches 120 that extend toward the long side X2 side from the long side X1 side are formed in parallel to each other at the predetermined interval. Further, the outermost peripheral trench 160 is formed in a surrounding manner around the trenches 120 along the outermost periphery of the semiconductor base body 110.

(3) Insulation Region Forming Step

Figure 5C:
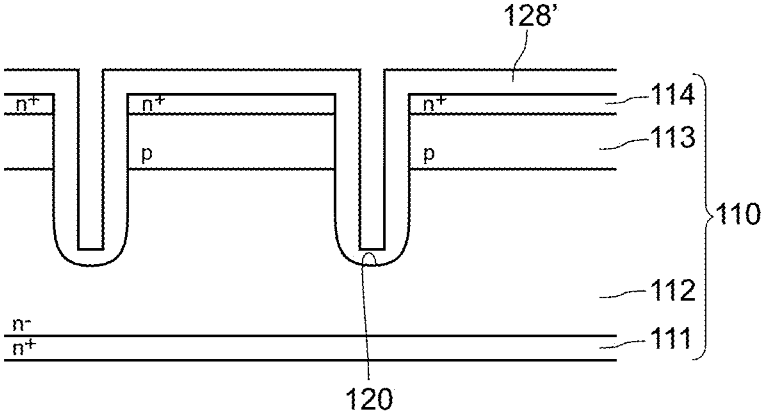

Next, an insulation film 128' is formed on an entire region of a surface of the semiconductor base body 100 including inner peripheral surfaces of the trenches 120 and an inner peripheral surface of the outermost peripheral trench 160 (FIG. 5C). The insulation film 128' is, for example, an oxide film formed by a CVD method.

(4) Shield Electrode Forming Step

Figure 5D:
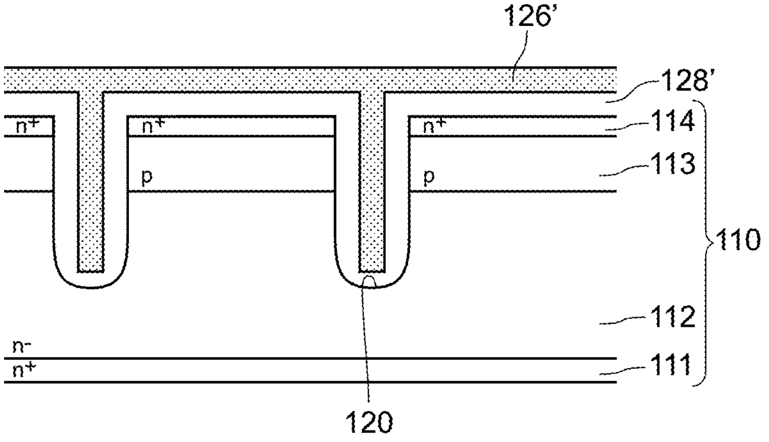

Next, polysilicon 126' is stacked on the entire region of the surface of the insulation film 128' (see FIG. 5D). At this stage of the step, polysilicon 126' is stacked in the trenches 120 and the outermost peripheral trench 160 by way of the insulation film 128'. Next, the polysilicon 126' is removed by etching while leaving an amount of the polysilicon 126' stacked in the trenches 120 to a predetermined height and an amount of the polysilicon 126' stacked in the outermost peripheral trench 160 (see FIG. 6A). More specifically, in the region that is sandwiched by the regions of the peripheral region A2 that overlaps with the regions where the gate lines GL1, GL2 are formed while leaving the polysilicon 126' in an approximately half space in the trenches 120. On the other hand, outside (on the long-side X1 side and on the long-side X2 side) the region of the peripheral region A2 that overlaps with the region where the GL1, GL2 are formed, the polysilicon 126' is removed while leaving a most of the space in the trench 120. The polysilicon 126' left in the trench 120 forms the shield electrode 126. The polysilicon 126' in the outermost peripheral trench 160 becomes an embedded electrode 162.

(5) Insulation Region Forming Step

Figure 6A:
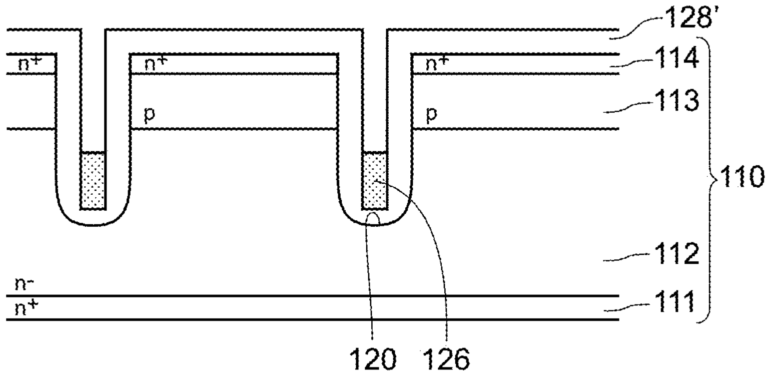
FIG. 6A to FIG. 6D are views illustrating the method for manufacturing the semiconductor device 100 according to an embodiment 1.
Figure 6B:
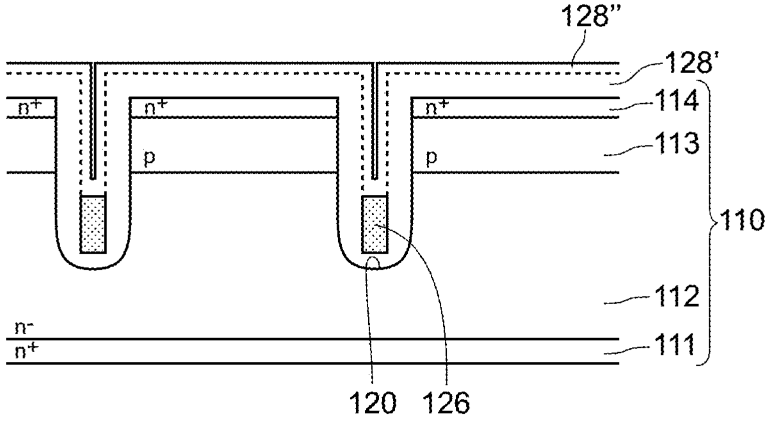
Figure 6C:
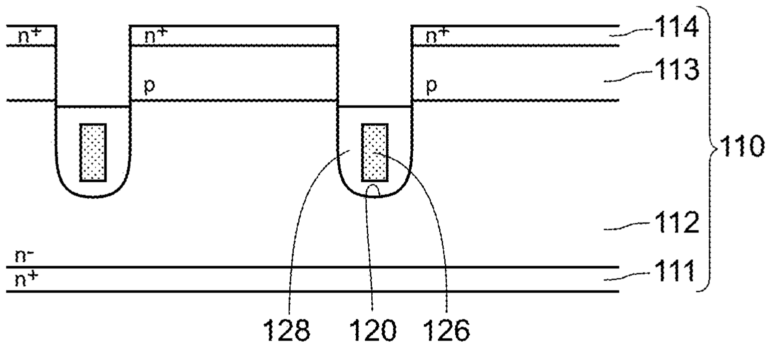

Next, an insulation film 128" is formed by a CVD method, for example, on the insulation film 128' and the shield electrodes 126 (see FIG. 6B). Next, a mask (not illustrated in the drawings) is formed on the outermost peripheral trench 160 and the embedded electrode 162 in the peripheral region A2. Next, the insulation film 128' and the insulation film 128" are removed by etching while leaving the insulation film 128" between the shield electrode 126 in each trench 120 and the inner peripheral surface of each trench 120 and on the shield electrode 126 in each trench 120 (see FIG. 6C). The insulation film 128" on the shield electrode 126 forms a portion of the insulation region 128.

(6) Gate Insulation Film Forming Step

Figure 6D:
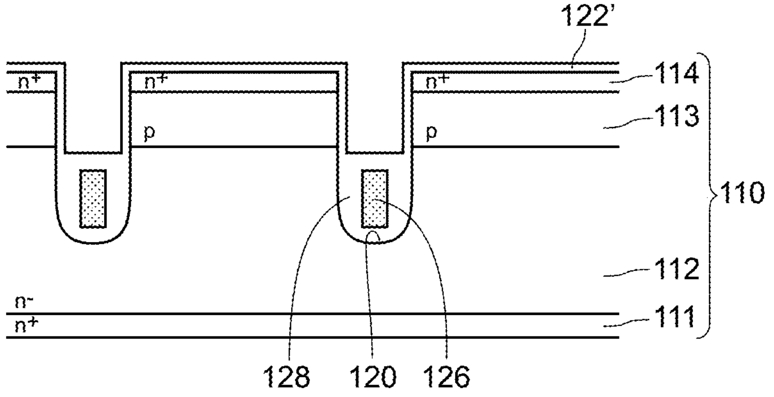

Next, a thermal oxide film 122' is formed on the semiconductor base body 110 and the insulation regions 128 in the trenches (see FIG. 6D). At this stage of the step, the thermal oxide film 122' formed on the side wall of the trench 120 forms the gate insulation film 122. Further, the thermal oxide film 122' on the insulation film 128' and the insulation film 128" forms a portion of the insulation region 128.

(7) Gate Electrode Forming Step

Figure 7A:
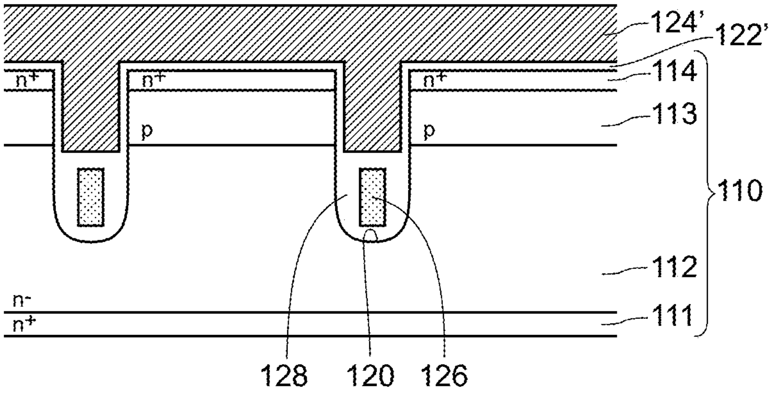
FIG. 7A to FIG. 7D are views illustrating the method for manufacturing the semiconductor device 100 according to the embodiment 1.
Figure 7B:
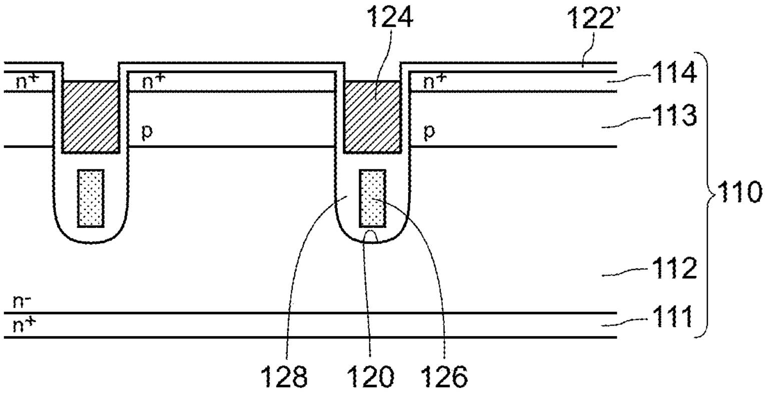
Figure 7C:
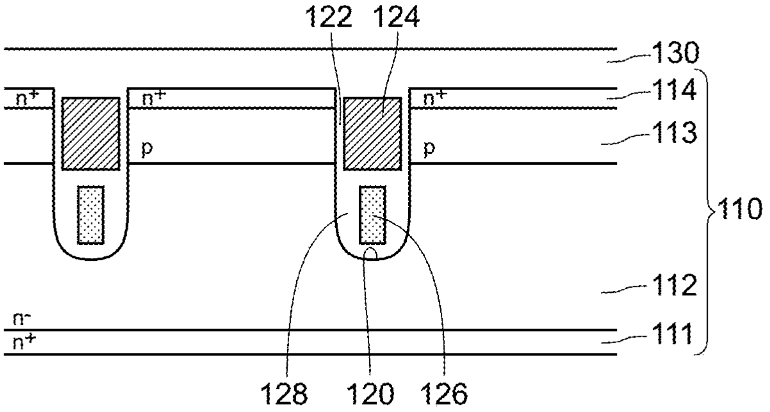
Figure 7D:
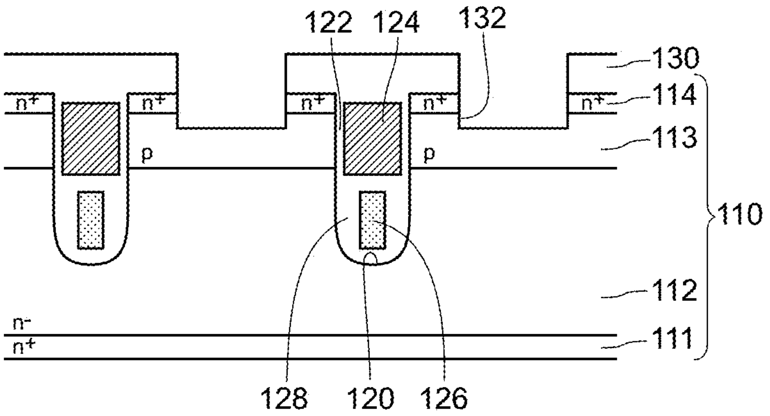

Next, a polysilicon layer 124' is formed on the thermal oxide film 122' (see FIG. 7A). Next, the polysilicon layer 124' is removed by etching while leaving a portion sandwiched by the thermal oxide film 122' (the gate insulation film 122) in each trench 120 (see FIG. 7B). With such an operation, a plurality of gate electrodes 124 are formed in the plurality of respective tranches 120 by way of the gate insulation films 122.

(8) Interlayer Insulation Film Forming Step

A mask on the peripheral region A2 is removed. Next, the interlayer insulation film 130 is formed on the entirety of the surface of the semiconductor base body 110. (see FIG. 7C).

(9) Contact Trench Forming Step

Next, by etching a predetermined region (a center in the embodiment 1) of a region sandwiched by the trenches disposed adjacently to each other, a contact trench 132 that is disposed at a position deeper than a lowermost bottom portion of the source region 114 of the semiconductor base body 110 and has a depth at which the contact trench 132 is brought into contact with the base region 113 is formed. (see FIG. 7D). At this stage of the step, the contact trench 132 is formed such that an end portion of the contact trench 132 on a long side x1 side and an end portion of the contact trench 132 on a long side x2 side are brought into contact with p-type peripheral regions 117. Further, contact holes are formed in the peripheral region A2 at a predetermined position on the embedded electrode 162, at a position that forms an end portion of the shield electrode 126 and a position that forms an end portion of the gate electrode 124, and a contact plug is formed in the respective contact holes (not illustrated in the drawings).

(10) First p-Type Dopant Doping Step (Second-Conductive-Type Dopant Doping Step)

Next, a mask (not illustrated in the drawings) having openings at regions of contact trenches 132 is formed on the entirety of a surface side of the semiconductor base body 110. Next, a bottom portion of the contact trench 132 is doped with a p-type dopant (for example boron) such that a peak position of the dopant concentration is deeper than a bottom portion of the base region 113 (see FIG. 8A). At this stage of the step, assuming a flying distance of the p-type dopants as Rp and a length from a contact position between the semiconductor base body 110 and the source electrode 140 to the bottom portion of the base region as D (see FIG. 1A), the relationship of Rp>D is satisfied. A dose amount of p-type dopants in the first second-conductive-type dopant doping step is less than a dose amount of p-type dopants in forming the base region (a dose amount in forming the base region 113 by ion doping).

(11) Second p-Type Dopant Doping Step

Figure 8A:
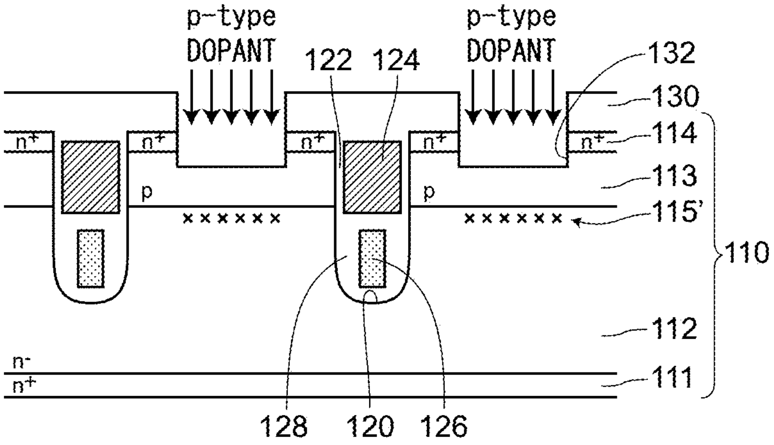
FIG. 8A to FIG. 8D are views illustrating the method for manufacturing the semiconductor device 100 according to the embodiment 1.
Figure 8B:
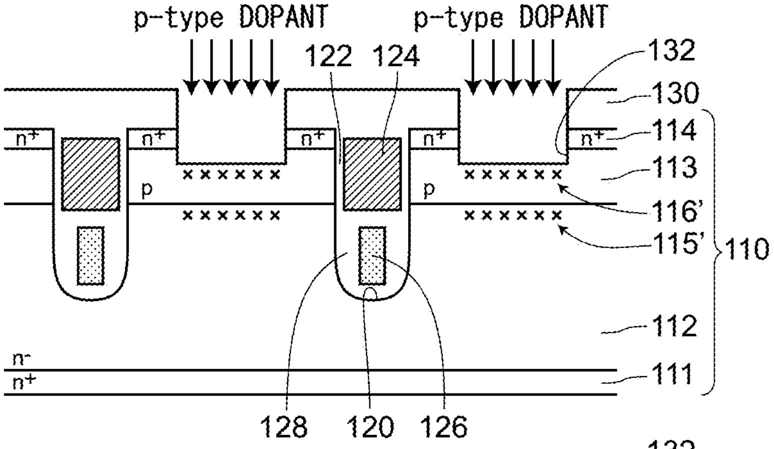

Next, the bottom portion of the contact trench 132 is doped with p-type dopants (for example, boron) such that a peak position of dopant concentration becomes shallower than the bottom portion of the base region 113 (see FIG. 8B). At this stage of the step, assuming a flying distance of the p-type dopants as Rp and a length from the contact position between the semiconductor base body 110 and the source electrode 140 to the bottom portion of the base region as D, the relationship of Rp<D is satisfied. Further, a dose amount of p-type dopants in the second second-conductive-type dopant doping step is larger than a dose amount of p-type dopants in forming the base region (a dose amount in forming the base region 113 by ion doping).

(12) Protruding Region and Contact Region Forming Step

Figure 8C:
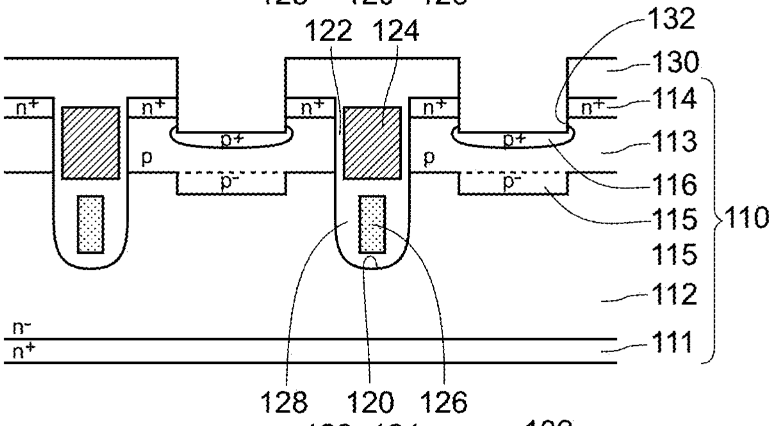
Figure 8D:
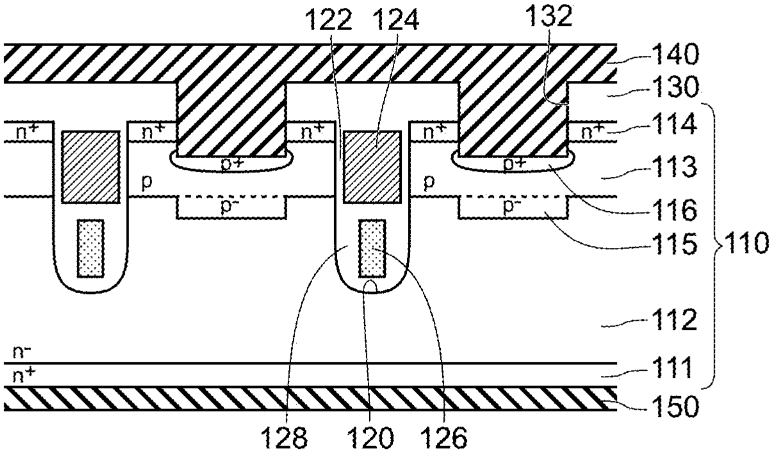

Next, the p-type dopants are diffused by heating the semiconductor base body 110 thus forming p-type protruding regions 115 and the contact regions 116 (see FIG. 8C). At this stage of the step, the p-type protruding region 115 is formed, in the region sandwiched between the trenches 120 disposed adjacently to each other, in a state where the p-type protruding region 115 is disposed away from the trenches 120 and protrudes toward the drift layer 112 from the bottom portion of the base region 113. Further, the p-type protruding region 115 is formed such that a depth position of a deepest portion of the p-type protruding region 115 is shallower than a depth position of a deepest portion of the trench 120, and a total amount of dopants in a depth-direction cross section of the p-type protruding region 115 is smaller than a total amount of dopants in a depth-direction cross section of the base region 113.

(13) Front-Surface-Electrode and Back-Surface Electrode Forming Step

Next, the mask used in the first p-type dopant doping step and the second p-type dopant doping step is removed (not illustrated in the drawings). A metal film is formed on the interlayer insulation film 130 and the semiconductor base body 110, and the metal film is etched so that the source electrode 140 (see FIG. 5A), the source lines SL1, SL2, the gate pad GP, and the gate lines GL1, GL2 are formed. At this stage of the step, the metal film intrudes also into the contact trench 132 so that the base region 113 and the source region 114 are connected with each other via the contact trench 132. Further, an end portion of the gate electrode 124 is connected with the source lines SL1, SL2 via the contact plugs SLC, and an end portion of the shield electrode 126 is connected to the gate lines GL1. GL2 via contact plugs GLC. Further, the drain electrode 150 (back surface electrode) is formed on a surface of the back surface side (low-resistance semiconductor layer 111 side) of the semiconductor base body 110.

The semiconductor device 100 according to the embodiment 1 is formed as described above.

In (1) Semiconductor base body preparation step, the semiconductor base body having the p-type base region 113 that is formed on the surface of the drift layer 112 and the n-type ($n^+$-type) source region 114 that is formed on the entire surface of the base region 113 is prepared in advance. However, the present invention is not limited to such a configuration. The semiconductor base body on which the low resistance semiconductor layer 111 and the drift layer 112 is prepared, the steps ranging from (2) trench forming step to (7) gate electrode forming step are performed, and the p-type base region 113 and the n-type ($n^+$-type) source region 114 may be formed after (7) gate electrode forming step.

3. Test Example 1

The test example 1 is a test example for checking that the path for holes that flow into the base region 113 is widened by forming the protruding region 115.

(1) In Re Sample

A semiconductor device 800 according to a comparison example 1 is a semiconductor device substantially equal to a semiconductor device according to the embodiment 1 except for a point that a protruding region is not formed and a point that an upper surface of a gate electrode is recessed at a center portion thereof (see FIG. 9C).

A semiconductor device 100A according to an example 1 is a semiconductor device substantially equal to the semiconductor device according to the embodiment 1 except for a point that an upper surface of a gate electrode is recessed at a center portion thereof (see FIG. 9A).

(2) Test Method

With respect to the comparison example 1 and the example 1, hole current densities in respective regions of a semiconductor base body are calculated by computer simulation, and the hole current densities are plotted in different colors (see FIG. 9B and FIG. 9D).

(3) Result

In the semiconductor device 800 according to the comparison example 1, as illustrated in FIG. 9D), it is found that the hole current density is increased only in a region that is in contact with a trench 820 in a drift layer 812. Accordingly, it is found that, when an avalanche breakdown occurs, the carries (holes) that are generated in the vicinity of a bottom portion of the trench 820 and approach to an area in the vicinity of a base region 813 directly move toward a base region 813 along an edge of the trench 820 so that a large amount of holes flow into a region of the base region 813 that is in contact with the trench 820.

On the other hand, in the semiconductor device 100A according to the embodiment 1, as illustrated in FIG. 9B, it is found that the hole current density is increased not only in a region of a drift layer 112 that is in contact with a trench 120 but also a region from such a region to the protruding region 115. Accordingly, it is found that, when an avalanche breakdown occurs, carriers (holes) that are generated in the vicinity of a bottom portion of the trench 120 and approach to an area in the vicinity of the base region 113 not only directly move toward the base region 113 along the edge of the trench 120 but also generate the components that flow toward the protruding region 115 and flow into the base region 113 via the protruding region 115. Accordingly, it is confirmed that a path of holes that flow into the base region 113 can be widened by the formation of the protruding region 115.

4. Test Example 2

A test example 2 is a test example performed for confirming that, by setting a total amount of dopants in a depth-direction cross section of a protruding region smaller than a total amount of dopants in a depth-direction cross section of the base region 113, when an avalanche breakdown occurs, it is possible to prevent the concentration of an electric field in the vicinity of an intermediate portion between the trenches disposed adjacently to each other and hence, the lowering of a breakdown strength can be prevented.

(1) In Re Sample

The comparison example 2 is a semiconductor device substantially equal to the semiconductor device according to the embodiment 1 except for a point that protruding regions are not formed (see FIG. 11(*a*)).

The example 2, the comparison examples 3, 4, 5 are semiconductor devices substantially equal to the semiconductor device according to the embodiment 1 except for a point that dose amounts of the protruding regions 115 are respectively $5\times10^{12}$ $cm^{-3}$, $6\times10^{12}$ $cm^{-3}$, $7\times10^{12}$ $cm^{-3}$, and $1.0\times10^{13}$ $cm^{-3}$ (see FIG. 11(*b*) to (see FIG. 11(*e*)).

A dose amount in the base region is assumed as $5.8\times10^{12}$ $cm^{-3}$. The protruding region 115 is formed by implanting and diffusing p-type dopants with acceleration energy of 330 KeV.

(2) Test Method

In the embodiment 2 and the comparison examples 2 to 5, a breakdown strength with respect to a dose amount in the protruding region is calculated, and the breakdown strength is plotted on a graph where a dose amount in the protruding region is taken on an axis of abscissas and a breakdown strength is taken on an axis of ordinates (see FIG. 10). Further, the impact ionization rate distributions in respective regions of the semiconductor base body are calculated by computer simulation and are plotted in different colors (see FIG. 11).

(3) Result 1

As illustrated in FIG. 10, in the comparison example 2 (having no protruding region) and the example 2, a breakdown strength was approximately 220V and hence, a sufficient breakdown strength was ensured. On the other hand, in the comparison example 3, a breakdown strength was approximately 200V or slightly more, and a breakdown strength in the comparison example 4 was approximately 190V, and a breakdown strength in the comparison example 5 was approximately 170V. From this result, it was confirmed that a sufficient breakdown strength can be ensured in the comparison example 2 (non-protruding region) and the example 2. On the other hand, in the comparison examples 3 to 5, a sufficient breakdown strength was not ensured. Accordingly, it was found that a breakdown strength is lowered in a case where a dose amount in the protruding region is smaller than a dose amount in the base region. From this result, it was confirmed that the lowering of a breakdown strength can be prevented by setting a total amount of dopants in a depth-direction cross section of the protruding region smaller than a total amount of dopants in a depth-direction cross section of the base region 113.

(4) Result 2

In the comparison examples 3 to 5, a region where impact ionization is liable to occur is formed in the vicinity of the center of the region sandwiched by the trenches disposed adjacently to each other (the region surrounded by a broken line B in FIG. 11(*c*) to FIG. 11(*e*) (see FIG. 11(*c*) to FIG. 11(*e*)). Accordingly, when an avalanche breakdown occurs, electric field is an concentrated in an area in the vicinity of an intermediate area of the region sandwiched by the trenches disposed adjacently to each other (where the lowering of a breakdown strength is liable to occur) so that a breakdown strength is lowered.

On the other hand, in the example 2, a region where impact ionization is liable to occur is formed at a position shifted from the center (the position closer to the trench 120 side than to the center) (see FIG. 11(*a*) and FIG. 11(*b*)). Accordingly, the regions where the impact ionization occurs can be dispersed. Accordingly, it was confirmed that it is possible to prevent the concentration of an electric field to the area in the vicinity of the intermediate portion between the trenches disposed adjacently to each other so that the lowering of the breakdown strength can be prevented also from this point of view.

5. Advantageous Effects of Semiconductor Device 100 and Method for Manufacturing Semiconductor Device According to Embodiment 1

According to the semiconductor device 100 and the method for manufacturing the semiconductor device according to the embodiment 1, the semiconductor base body 110 includes the p-type protruding region 115 that is formed so as to protrude toward the drift layer 112 from the bottom portion of the base region 113 sandwiched by the trenches 120 disposed adjacently to each other, and is spaced apart from the trenches 120. Accordingly, not only a depletion layer expands in a vertical direction from a pn junction between the base region 113 and the drift region 112 but also the depletion layer expands also in the lateral direction from a pn junction on a side surface of the protruding region 115. Accordingly, even in a case where the drift layer 112 between the trench 120 and the protruding region 115 is liable to be easily depleted so that dopant concentration in the drift layer 112 is increased, it is possible to deplete the drift layer 112 without increasing a drain voltage more than necessary. As a result, it is possible to set a gate-drain quantity of charge Qgd to a small value and hence, a switching loss and a gate drive loss can be reduced.

Furthermore, the gate-drain quantity of charge Qgd can be set to a small value and hence, in turning on or off the gate, a time necessary for charging or discharging a gate-drain capacitance Cgd can be shortened whereby a switching speed is increased. That is, although a drain-source voltage Vds is lowered and elevated respectively in a period (a mirror period) during which the gate-drain quantity of charge Qgd is charged or discharged, it is sufficient to use a small gate-drain quantity of charge Qgd and hence, a switching speed is increased.

Further, by adopting such a structure, the gate-drain capacitance Cgd is reduced and hence, Cgd/(Cgs+Cgd) is reduced. As a result, it is also possible to acquire an advantageous effect that a false firing referred to as self-turn-on or shoot through can be suppressed.

Further, according to the semiconductor device 100 and the method for manufacturing a semiconductor device according to the embodiment 1, the above-mentioned configuration is adopted and hence, when an avalanche breakdown occurs, holes generated in the vicinity of the bottom portion of the trench 120 flow into not only a region that is in contact with the trench 120 in the base region 113 but also the protruding region 115 (see FIG. 9A and FIG. 9B). Accordingly, a path for holes that flow into the base region 113 is widened and hence, it is possible to prevent the occurrence of a phenomenon that a potential of the base region 113 is locally increased. As a result, it is possible to prevent the occurrence of a parasitic bipolar operation.

In a case where a total amount of dopants in a depth-direction cross section of the protruding region 115 is set larger than a total amount of dopants in a depth-direction cross section of the base region 113, when an avalanche breakdown occurs, an impact ionization is liable to occur in the vicinity of an intermediate position between the trenches 120 disposed adjacently to each other (where a breakdown strength being liable to be lowered) so that an electric field is concentrated to the intermediate position between the trenches 120 disposed adjacently to each other and a breakdown strength is lowered. For example, in a case where a p-type semiconductor region is formed below the base region and, a p region having a larger dopant concentration than the base region is formed below the p-type semiconductor region, an electric field concentrates on a periphery around the p region so that a breakdown strength is lowered. On the other hand, according to the semiconductor device 100 and the method for manufacturing a semiconductor device according to the embodiment 1, a total amount of dopants in the depth-direction cross section of the protruding region is set equal or smaller than a total amount of dopants in the depth-direction cross section of the second-conductive-type semiconductor region. As a result, when an avalanche breakdown occurs, an impact ionization is liable to occur around the trench and minimally occurs in the intermediate position between the trenches 120 disposed adjacently to each other (see FIG. 11(*a*)). Accordingly, it is possible to prevent the occurrence of the phenomenon that an electric field concentrates on the region in the vicinity of the intermediate position between the trenches disposed adjacently to each other and hence, lowering of a breakdown strength can be prevented.

Further, in a case where the depth position of the deepest portion of the protruding region 115 is deeper than the depth position of the deepest portion of the trench 120, a current path formed in a case where a current is made to flow between the source and the drain is closed and hence, an ON resistance may be increased. For example, in a semiconductor device that includes a super junction structure, a p-type region is formed downward from a base region. In this case, it is necessary to take a charge balance between the p-type region and an n-type drift layer and hence, the p-type region (the p-type column) is formed to a region deeper than a trench. In this case, a current path formed in a case where a current is made to flow between a source and a drain is closed by the p column and hence, an ON resistance becomes small. On the other hand, according to the semiconductor device 100 and the method for manufacturing a semiconductor device 100 according to the embodiment 1, the depth position of the deepest portion of the protruding region 115 is shallower than the depth position of the deepest portion of the trench 120 and hence, even when a current is made to flow between the source and the drain, the current path is minimally closed whereby the ON resistance is minimally lowered.

Further, according to the semiconductor device 100 of the embodiment 1, the semiconductor device includes the contact trenches 132 that are formed such that the contact trenches 132 penetrate the interlayer insulation film 130 and reach at least the base region 113 of the semiconductor base body 110. Accordingly, it is possible to allow a relatively large current to flow through the semiconductor device 100, and holes that flow from the drift layer 112 into the base region 113 or holes that flow from the drift layer 112 into the base region 113 via the protruding portions 115 can be drawn easily. Further, the protruding region 115 is disposed below the contact trench 132 and hence, holes that flow into the base region 113 via the protruding region 115 can be easily drawn. Still further, with the above-mentioned configuration, by applying ion doping to the bottom portion of the contact trench 132, it is possible to perform ion doping of forming the protruding region 115 at a relatively low voltage.

Further, according to the semiconductor device 100 of the embodiment 1, the source region 114 is in contact with the side surfaces of the contact trench 132 and hence, the contact trench 132 is formed to a depth position deeper than a depth position of the source region 114. Accordingly, by applying ion doping to the bottom portion of the contact trench 132, it is possible to perform ion doping of forming the protruding region 115 at a further low voltage.

Further, according to the semiconductor device 100 of the embodiment 1, the semiconductor base body 110 is formed in the region that is in contact with the bottom portion of the contact trench 132, and has the contact region 116 of a p-type having higher dopant concentration than the base region 113. Accordingly, the semiconductor base body 110 can reduce a contact resistance with the source electrode 140. Further, the semiconductor base body 110 is formed at the bottom portion of the contact trench 132, the contact region 116 can be formed as a relatively low voltage.

Further, according to the semiconductor device 100 of the embodiment 1, the protruding region 115 is formed at the center of the region sandwiched by the trenches disposed adjacently to each other. With such a configuration, a depletion layer extends in a lateral direction toward the respective trenches from both side surfaces of the protruding region 115 and hence, the regions between the protruding regions 115 and the trenches 120 disposed adjacently to the protruding region 115 can be uniformly depleted. Accordingly, a breakdown strength can be increased.

Further, according to the semiconductor device 100 of the embodiment 1, the semiconductor device includes, in the trench 120: the shield electrodes 126 that are formed at the position spaced apart from the gate electrode 124 and the inner peripheral surface of the trench 120; and the insulation region 128 formed between the gate electrode 124 and the shield electrode 126 and between the shield electrode 126 and the inner peripheral surfaces of the trench 120. Accordingly, a distance from the gate electrode 124 to the bottom portion of the trench 120 is elongated and hence, a gate-drain capacitance Cgd is lowered whereby a switching speed can be increased. A distance from a corner portion of the trench 120 where the concentration of an electric field is liable to occur to the gate electrode 124 can be elongated and the electric field can be attenuated by the insulation layer region 128 and hence, a breakdown strength can be increased.

Further, according to the semiconductor device 100 of the embodiment 1, in the peripheral region A2, the semiconductor base body 110 is formed on a surface of the drift layer 112, is connected to the base region 113, and has a p-type peripheral region 117 where a depth position of a deepest portion is deeper than a depth position of a deepest position of the base region 113, and dopant concentration of the p-type peripheral region 117 is larger than dopant concentration of the base region 113. With such a configuration, also in the peripheral region A2 where the trenches 120 are not formed, holes that are generated in the drift layer 112 can be efficiently recovered and hence, it is possible to provide the semiconductor device that ensures a high breakdown strength and a high avalanche breakdown strength.

Further, according to the semiconductor device 100 of the embodiment 1, the p-type peripheral region 117 is in direct contact with the source electrode 140 that is formed in the cell region A1. Accordingly, a potential of the p-type peripheral region 117 can be set equal to a source potential, and the collected holes can be efficiently moved to the source electrode 140.

Further, according to the method for manufacturing a semiconductor device of the embodiment 1, assuming a flying distance of p-type dopants that form the protruding region 115 as Rp and a length from the position at which the semiconductor base body 110 is in contact with the source electrode 140 to the bottom of the base region 113 as D, the relationship of Rp>D is satisfied. Accordingly, it is possible to form the protruding region 115 at the depth position deeper than the bottom portion of the base region 113.

Further, according to method for manufacturing a semiconductor device of the embodiment 1, a dose amount of p-type dopants that form the protruding region 115 in the first p-type dopant doping step is smaller than a dose amount of the p-type dopants that form the base region 113 and hence, a total amount of dopants in the depth-direction cross section of the protruding region 115 can be set smaller than a total amount of dopants in the depth-direction cross section of the base region 113.

Embodiment 2

Figure 12:
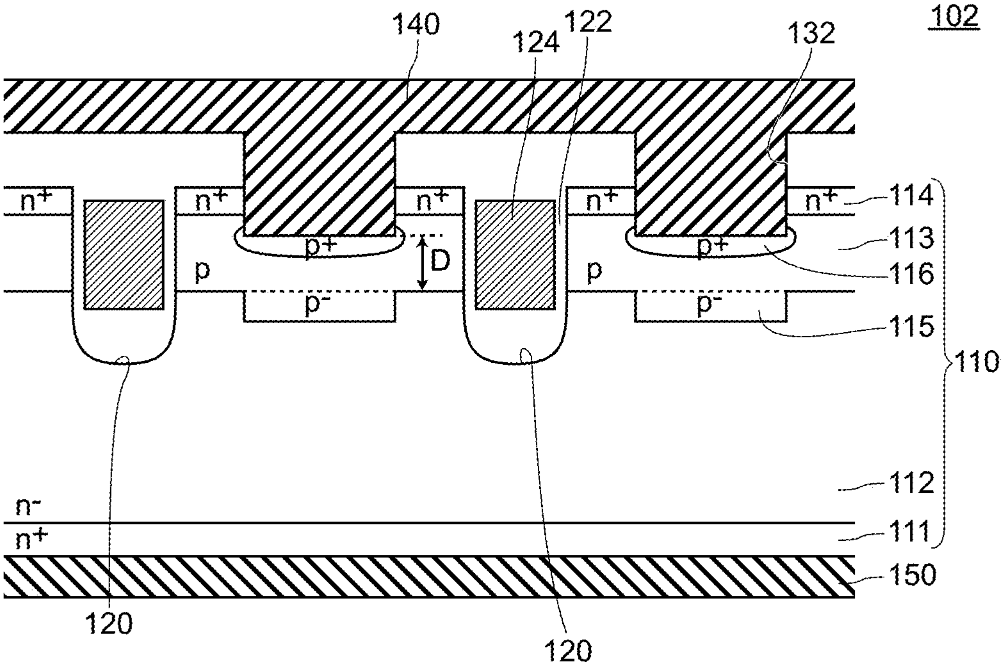
FIG. 12 is a cross-sectional view illustrating a semiconductor device 102 according to the embodiment 2.

A semiconductor device 102 of the embodiment 2 has basically substantially the same configuration as the semiconductor device 100 according to the embodiment 1. However, the semiconductor device 102 of the embodiment 2 differs from the semiconductor device 100 according to the embodiment 1 with respect to a point that the semiconductor device 102 of the embodiment 2 does not have a shield gate structure (see FIG. 12). That is, the semiconductor device 102 of the embodiment 2 includes neither shield electrodes 126 nor insulation regions 128. That is, in a trench 120, an insulation film formed along an inner peripheral surface (an insulation film formed on a side wall surface forming a gate insulation film 122) and a gate electrode 124 disposed by way of an insulation film are provided.

In this manner, although the semiconductor device 102 of the embodiment 2 differs from the semiconductor device 100 of the embodiment 1 with respect to the point that the semiconductor device 102 of the embodiment 2 does not have the shield gate structure, in the same manner as the semiconductor device 100 of the embodiment 1, the semiconductor base body includes a protruding region of a second conductive type that is formed in a protruding manner toward a first-conductive-type semiconductor layer from a bottom portion of a second-conductive-type semiconductor region and is spaced apart from the trench in a region sandwiched between the trenches disposed adjacently to each other. Accordingly, even in a case where dopant concentration in a drift layer 112 is increased, it is possible to provide a semiconductor device where a switching loss and a gate drive loss are small, and a parasitic bipolar operation minimally occurs.

The semiconductor device 102 of the embodiment 2 has substantially the same configuration as the semiconductor device 100 of the embodiment 1 except for a point that the semiconductor device 102 of the embodiment 2 does not have the shield gate structure. Accordingly, the semiconductor device 102 of the embodiment 2 acquires advantageous effects that are equal to the advantageous effects of the semiconductor device 101 amongst all advantageous effects acquired by the semiconductor device 100 of the embodiment 2.

Although the present invention has been described based on the above-mentioned embodiments, the present invention is not limited to the above-mentioned embodiments. The present invention can be carried out in various modes without departing from the gist of the present invention and, for example, the following modification also fall within the scope of the present invention.

(1) The positions and the sizes described in the above-mentioned respective embodiments (including the respective modifications, the same understanding also applicable to the following modifications) are described for an exemplifying purpose, and can be modified within the scope where the advantageous effects of the present invention are not impaired. Further, the description has been made by setting the first conductive type as the n-type and the second conductive type as the p-type. However, the first conductive type may be set as the p-type and the second conductive type may be set as the n-type.

(2) In the above-mentioned respective embodiments, the contact trench is formed with the depth deeper than the depth position of the bottom portion of the source region 114. However, the present invention is not limited to such a configuration. The contact trench may be formed with the depth equal to the bottom portion of the source region 114 or shallower than the bottom portion of the source region 114. Further, in a case where the base region 113 appears on a surface of the semiconductor base body 110, the contact trench may be in contact with the semiconductor base body 110 without digging the semiconductor base body.

(3) In the above-mentioned respective embodiments, the source electrode and the source line are connected to each other. However, the present invention is not limited to such a configuration. The source electrode and the source line may not be connected to each other.

Figure 13:
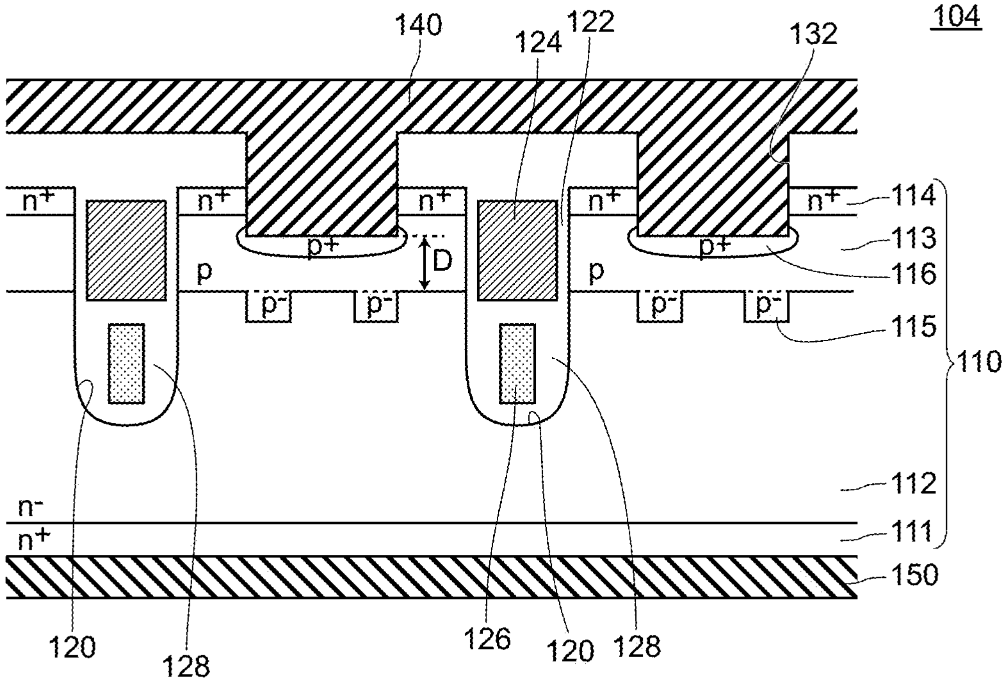
FIG. 13 is a cross-sectional view illustrating a semiconductor device 104 according to a modification
Figure 14:
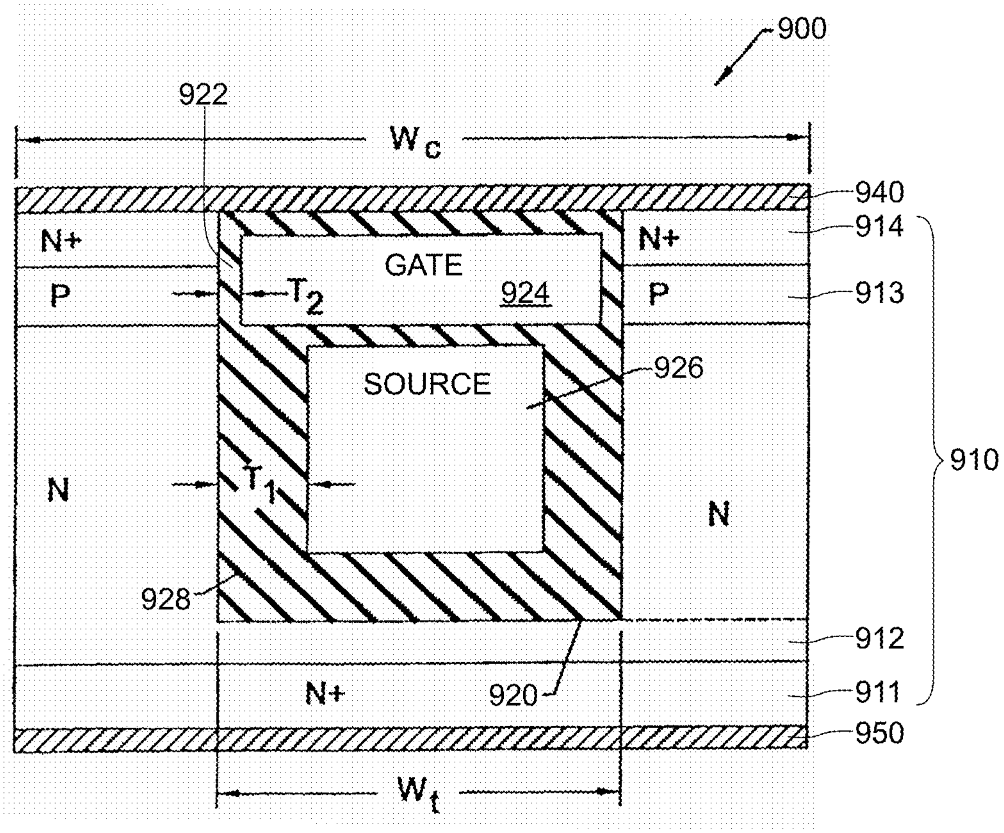
FIG. 14 is a cross-sectional view of a conventional semiconductor device 900. A symbol 911 indicates a low resistance semiconductor layer ($n^+$-semiconductor layer) and a symbol 950 indicates a drain electrode.

(4) In the above-mentioned respective embodiments, the number of the protruding region 115 is set to one. However, the present invention is not limited to such a configuration. A plurality of protruding regions 115 may be formed. Further, in the above-mentioned respective embodiments, the protruding region 115 is formed at the center of the trenches 120 disposed adjacently. However, the present invention is not limited to such a configuration. The protruding region 115 may be formed at a place other than the center between the trenches 120 disposed adjacently to each other (see FIG. 13 with respect to a case where two protruding regions 115 are formed at positions avoiding the center between the trenches 120 disposed adjacently to each other, a semiconductor device 104 according to the modification)

(5) In the above-mentioned respective embodiments, a MOSFET is used as the semiconductor device. However, the present invention is not limited to such a case. As the semiconductor device, an IGBT, a thyristor, a triac or other suitable components may be used.

(6) In the above-mentioned respective embodiments, a total amount of dopants in the depth-direction cross section of the protruding region 115 may be set smaller than a total amount of dopants in the depth-direction cross section of the base region 13. However, the present invention is not limited to such a configuration. A total amount of dopants in the depth-direction cross section of the protruding region 115 may be set equal to a total amount of dopants in the depth-direction cross section of the base region 13.

The invention claimed is:

1. A semiconductor device comprising:

a semiconductor base body including a first-conductive-type semiconductor layer, a second-conductive-type semiconductor region formed on a surface of the first-conductive-type semiconductor layer, and a first-conductive-type semiconductor region formed on a surface of the second-conductive-type semiconductor region;

a plurality of trenches formed on a surface of the semiconductor base body, wherein, in each of the plurality of trenches, a lowermost bottom portion is brought into contact with the first-conductive-type semiconductor layer, and a side wall is brought into contact with the first-conductive-type semiconductor layer, the second-conductive-type semiconductor region and the first-conductive-type semiconductor region;

a gate insulation film formed on the side wall of each of the plurality of trenches;

a gate electrode formed in each of the plurality of trenches by way of the gate insulation film;

an interlayer insulation film formed above the gate electrode and the semiconductor base body; and a surface electrode formed on the interlayer insulation film, the surface electrode being connected to the second-conductive-type semiconductor region and the first-conductive-type semiconductor region, wherein the semiconductor base body includes, in a region sandwiched by the trenches disposed adjacently to each other, a second-conductive-type protruding region that is formed so as to protrude toward the first-conductive-type semiconductor layer from a bottom portion of the second-conductive-type semiconductor region, and is spaced apart from the trench, a depth position of a deepest portion of the protruding region is shallower than a depth position of a deepest portion of the trench, a peak position of dopant concentration in the protruding region is deeper than a bottom portion of the second-conductive-type semiconductor region, and a total amount of dopants in a depth-direction cross section of the protruding region is equal to or smaller than a total amount of dopants in a depth-direction cross section of the second-conductive-type semiconductor region.

2. The semiconductor device according to claim 1, further comprising: a contact trench that is formed in the interlayer insulation film such that the contact trench penetrates the interlayer insulation film and has a depth that reaches at least the second-conductive-type semiconductor region of the semiconductor base body, wherein the surface electrode is connected to the first-conductive-type semiconductor region and the second-conductive-type semiconductor region via the contact trench, and the protruding region is formed below the contact trench.

3. The semiconductor device according to claim 2, wherein the first conductive type semiconductor region is in contact with a side surface of the contact trench.

4. The semiconductor device according to claim 2, wherein the semiconductor base body is formed in a region that is in contact with a bottom portion of the contact trench, and further includes a contact region of a second conductive type having a dopant concentration higher than a dopant concentration of the second-conductive-type semiconductor region.

5. The semiconductor device according to claim 1, wherein the protruding region is formed at a center of a region sandwiched by the trenches disposed adjacently to each other.

6. The semiconductor device according to claim 1, further comprising:

a shield electrode formed at a position spaced apart from both an inner peripheral surface of the trench and the gate electrode in the trench; and an insulation region formed between the gate electrode and the shield electrode, and, between the shield electrode and an inner peripheral surface of the trench.

7. The semiconductor device according to claim 1, wherein a cell region in which a MOS structure is formed and a peripheral region that surrounds the cell region are defined on the semiconductor base body, in the cell region, the semiconductor base body includes at least:

the first-conductive-type semiconductor layer;

the second-conductive-type semiconductor region;

the first-conductive-type semiconductor region; and the protruding region, in the peripheral region, the semiconductor base body includes at least:

the first-conductive-type semiconductor layer; and a second-conductive-type peripheral region that is formed on a surface of the first conductive type semiconductor layer, and is connected with the second-conductive-type semiconductor region, wherein a depth position of a lowermost bottom portion of the second-conductive-type peripheral region is deeper than a depth position of a lowermost bottom portion of the second-conductive-type semiconductor region, and a total amount of dopants in a depth-direction cross section of the second-conductive-type peripheral region is larger than a total amount of dopants in a depth-direction cross section of the second-conductive-type semiconductor region.

8. The semiconductor device according to claim 7, wherein the second-conductive-type peripheral region is directly connected to the surface electrode formed in the cell region.

9. A method for manufacturing a semiconductor device comprising:

a semiconductor base body preparation step of preparing a semiconductor base body that includes a first-conductive-type semiconductor layer; a second-conductive-type semiconductor region formed on a surface of the first-conductive-type semiconductor layer; and a first-conductive-type semiconductor region formed on a surface of the second-conductive-type semiconductor region;

a trench forming step of forming a plurality of trenches on one surface of the semiconductor base body, wherein, in each of the plurality of trenches, a lowermost bottom portion is brought into contact with the first-conductive-type semiconductor layer, and a side wall is brought into contact with the first-conductive-type semiconductor layer, the second-conductive-type semiconductor region and the first-conductive-type semiconductor region;

a gate insulation film forming step of forming a gate insulation film formed on a region of the side wall of each of the plurality of trenches, the region of the side wall being in contact with at least the second-conductive-type semiconductor region;

a gate electrode forming step of forming a gate electrode in each of the plurality of trenches by way of the gate insulation film;

an interlayer insulation film forming step of forming an interlayer insulation film above the gate electrode and a surface of the semiconductor base body:

a contact trench forming step of a contact trench in the interlayer insulation film, the contact trench having a depth that allows the contact trench to reach at least the second-conductive-type semiconductor region of the semiconductor base body;

a second-conductive-type dopant doping step of doping second-conductive-type dopants toward a bottom portion of the contact trench such that a peak position of dopant concentration becomes deeper than a bottom portion of the second-conductive-type semiconductor region; and a protruding region forming step of forming a second-conductive-type protruding region in a region sandwiched between the trenches disposed adjacently to each other by diffusing the second-conductive-type dopants, the second-conductive-type protruding region being spaced apart from the trenches, the second-conductive-type protruding region being formed so as to protrude toward the first-conductive-type semiconductor layer from a bottom portion of the second-conductive-type semiconductor region, a depth position of a deepest portion of the second-conductive-type protruding region being shallower than a depth position of deepest portions of the trenches, a total amount of dopants in a depth direction cross section of the protruding region being equal to or smaller than a total amount of dopants in a depth direction cross section of the second-conductive-type semiconductor region.

10. The method for manufacturing a semiconductor device according to claim 9, wherein in the second-conductive-type dopant doping step, assuming a flying distance of the second-conductive-type dopants that form the protruding region as Rp and a length from a position at which the semiconductor base body is in contact with a surface electrode to a bottom portion of the second-conductive-type semiconductor region as D, a relationship of Rp>D is satisfied.

11. The method for manufacturing a semiconductor device according to claim 9, wherein a dose amount of the second-conductive-type dopants that form the protruding region in the second-conductive-type dopant dosing step is smaller than a dose amount of the second-conductive-type dopants that form the second-conductive-type semiconductor region.

* * * * *